United States Patent [19]
Gershenfeld et al.

[11] Patent Number: 6,025,726
[45] Date of Patent: *Feb. 15, 2000

[54] METHOD AND APPARATUS FOR DETERMINING THREE-DIMENSIONAL POSITION, ORIENTATION AND MASS DISTRIBUTION

[75] Inventors: Neil Gershenfeld, Somerville; Joshua R. Smith, Cambridge, both of Mass.

[73] Assignee: Massachusetts Institute of Technology, Cambridge, Mass.

[*] Notice: This patent is subject to a terminal disclaimer.

[21] Appl. No.: 09/200,609

[22] Filed: Nov. 30, 1998

Related U.S. Application Data

[63] Continuation of application No. 08/640,569, May 1, 1996, Pat. No. 5,844,415, which is a continuation-in-part of application No. 08/191,042, Feb. 3, 1994, abandoned.

[51] Int. Cl.[7] .................................................. G01R 27/26
[52] U.S. Cl. ..................... 324/671; 324/662; 324/690; 324/687; 324/663; 340/870.37
[58] Field of Search ................ 324/716, 663, 324/687, 662, 671, 688, 690; 280/735; 340/870.37

[56] References Cited

U.S. PATENT DOCUMENTS

| | | | |
|---|---|---|---|
| 3,843,924 | 10/1974 | Wahlgren | 324/725 |
| 4,980,519 | 12/1990 | Mathews | 178/19 |
| 5,214,388 | 5/1993 | Vranish | 324/683 |
| 5,525,843 | 6/1996 | Howing | 324/663 |
| 5,871,232 | 2/1999 | White | 280/735 |

*Primary Examiner*—Josie Ballato
*Assistant Examiner*—Jose M. Solis
*Attorney, Agent, or Firm*—Cesari and McKenna, LLP

[57] ABSTRACT

A quasi-electrostatic sensing system surrounds an electrically conductive mass with an electric field, the magnitude of which is sensed at one or more locations to resolve a property of interest concerning the mass. The object intercepts a part of the electric field extending beween the AC-coupled "sending" electrode and the other "receiving" electrodes, the amount of the field intercepted depending on the size and orientation of the sensed mass, whether or not the mass provides a grounding path, and the geometry of the distributed electrodes. Because the response of the field to an object is a complex nonlinear function, adding electrodes can always distinguish among more cases. In other words, each electrode represents an independent weighting of the mass within the field; adding an electrode provides information regarding that mass that is not redundant to the information provided by the other electrodes. A "forward model" that relates the behavior of the system to variations in the property to be measured is established, and "inversion" of this model facilitates recovery of the property based on system behavior. The invention is amenable to a wide variety of usages including the detection of user positions and gestures as a means of conveying two- and/or three-dimensional information to, for example, computers, appliances, televisions, furniture, etc.; provision of data input or instructional commands to a device; or sensing of proximity to a reference object for security purposes, to warn of danger, or to conserve energy by withholding power until a potential user approaches the object.

40 Claims, 11 Drawing Sheets

METHOD AND APPARATUS FOR DETERMINING THREE-DIMENSIONAL POSITION, ORIENTATION AND MASS DISTRIBUTION

RELATED APPLICATION

This is a continuation of U.S. Ser. No. 08/640,569, filed May 1, 1996, now U.S. Pat. No. 5,844,415 which is itself a continuation-in-part of U.S. Ser. No. 08/191,042, filed Feb. 3, 1994, now abandoned.

FIELD OF THE INVENTION

The present invention relates generally to the sensing of sensing of position and orientation of an electrically conductive mass within a defined spatial reference frame, and in particular to a sensing system that resolves the presence, orientation and salient characteristics of a person in a defined space based on variations in a displacement current.

BACKGROUND OF THE INVENTION

Position sensors are used to provide inputs for a variety of electronic devices. Some of these sensors are electromechanical devices, such as the ubiquitous "mouse" that is used to provide position input signals to digital computers. Other sensors, which are non-mechanical, usually make use of electrostatic or magnetic fields to provide position information. An example of an electrostatic sensor is a capacitive button switch, which is actuated when the user places a finger thereon; in so doing the user effectively increases the capacitance of a capacitor, with the resulting increase in capacitive current being sensed to indicate actuation of the button.

The non-mechanical sensors are advantageous in that they have no moving parts and moreover are, in theory at least, not restricted to operation over a small area such as a mousepad or the like. Actually, however, because of configuration and sensitivity considerations, these sensors are limited to a small area; indeed, when they are used as "pushbuttons," this is a desirable attribute of capacitive sensors.

Electromechanical sensors are limited by their construction to detection of specific types of user movements. For example, a mouse can detect position along a two-dimensional surface and transmit the user's actuation of "click" buttons mounted on the mouse; three-dimensional location and gestures other than the familiar button click, however, are beyond the mouse's capacity to detect. The prior electrostatic and magnetic sensors suffer from the same disabilities.

In fact, determining the position, mass distribution or orientation of an object within a defined space represents a highly complex problem due to the difficulty of resolving among cases which, while physically different, produce identical or insubstantially different sensor readings. For example, in an electric-field sensing system, a large object far away may produce the same signal as a smaller object close by. Naturally, the more sensors one employs, the greater will be the number of cases that may be unambiguously resolved, but as yet there exists no methodology for systematically designing a sensor arrangement capable of resolving a desired set of cases with the fewest number of sensors. Indeed, no current electrostatic sensor arrangement is capable of providing three-dimensional information throughout a defined space.

For example, a more advanced version of the capacitive button switch is described in published PCT application WO 90/16045 (Tait), which describes an array of receiver electrodes arranged about a central transmitting electrode. Even this type of configuration, however, is relatively crude in terms of the information it provides, since what is measured is variation in weighting among the arrayed electrodes. Arrangements such as this do not provide three-dimensional positional information. They do not meaningfully reduce the number of devices (i.e., electrodes) necessary to characterize position and orientation, nor provide an approach to obtaining an optimum number of devices. Moreover, the Tait device is not employed in a manner that is even capable of operating over three dimensions, much less distinguishing among different orientation/position cases. It is expected that contact will be complete in all cases—that is, the user's finger will actually touch the transmitting and receiving electrodes—rendering the approach unsuitable where such contact is not possible.

DESCRIPTION OF THE INVENTION

Brief Summary of the Invention

The present invention dispenses entirely with the need for contact between the object under observation and the sensor, utilizing knowledge of three-dimensional quasi-electrostatic field geometries to recover the three-dimensional position, mass distribution and/or orientation of an object within the field. The invention also supplies an approach to obtaining electrode arrangements optimal, in terms of the number of electrodes and their spatial distribution, for recovering a desired range of possible mass distributions, positions and/or orientations. The invention is advantageously used in connection with locating the positions and orientations of a single person or a person's body part (e.g., a hand), or the distribution of a group of people. For purposes of convenience, the term "person" as used herein broadly connotes an individual or the body part of an individual.

In a first aspect, the invention provides a basic hardware circuit that may be used in a modular fashion to construct an optimal sensing system. An AC signal is applied to a first electrode, and measurements taken of the current exiting that electrode and also the currents into a set of other electrodes distributed in space, and which are effectively connected to the ground return of the AC-coupled electrode. An electrically conductive mass to be sensed intercepts a part of the electric field extending beween the AC-coupled "sending" electrode and the other "receiving" electrodes, the amount of the field intercepted depending on the size and orientation of the sensed mass, whether or not the mass provides a grounding path, and the geometry of the distributed electrodes.

For example, in a simple case, such as that contemplated in the Tait application, a person is so close to a sending/receiving electrode pair that she effectively bridges the electrodes, increasing their capacitive coupling and, therefore, the current through the receiving electrode as compared with the current that would flow in the person's absence. If, however, the person is standing on the ground and is somewhat distant from the electrodes, her body provides a grounding path in addition to increasing the capacitive coupling. These two effects are opposed: the path to ground diverts some of the current, reducing the output at the receiving electrode, while enhanced capacitive coupling increases output current. (The grounding path is insignificant in the simple case where the person touches both electrodes, since the capacitive-coupling effect predominates.)

Also relevant is the absolute amount of current through the person, regardless of whether it reaches a receiving electrode or is shunted to ground. Indeed, if the person is close to the sending electrode but distant from the receiving electrodes, this will be the only relevant parameter.

In a second aspect, all of these measurements, in combination with knowledge of electrode geometry, are used to resolve a property of interest. Because the response of the field to an object is a complex nonlinear function, adding electrodes can always distinguish among more cases. In other words, each electrode represents an independent weighting of the mass within the field; adding an electrode provides information regarding that mass that is not redundant to the information provided by the other electrodes.

In accordance with this aspect, a "forward model," relating the behavior of the system to variations in the property to be measured, is established. The forward model may be characterized analytically or numerically, but in any case represents a relatively complete description of electrode responses over the spatial region of interest. Because the forward model relates system values to the parameters of the property that produced those values, it is possible to "invert" the model and reconstruct, for a given set of system values, the model parameters responsible therefor. Forward models are generally complex, and inversion therefore cannot ordinarily be accomplished analytically. Instead, in a preferred implementation, Bayesian inference techniques are used to find the parameters most likely to have given rise to the observed output. In an alternative implementation, techniques of error minimization are used to develop parameter values that account for the observed output with the least error. Yet another alternative involves numerical root finding.

In another aspect, the amount of information provided by each measurement is quantified in terms of its contribution to to the Bayesian probability analysis. Quantifying the effect of each measurement toward resolving uncertainty in this fashion gives a basis for comparing alternative sensor geometries, and for designing an optimal geometry—that is, one whose associated uncertainty, evaluated over the spatial region of interest, falls within acceptable limits.

In another aspect, already-known properties of the object are used to constrain the meaning of measured signal levels in order to extract the maximum amount of characterizing information. The forward model is thereby used to distinguish among possible "cases" or instance categories differing by identifiable unknown parameters.

To increase system performance—that is, to minimize the number of electrodes necessary to resolve ambiguity—the invention preferably includes means for switchably designating each electrode as either a transmitting or a receiving electrode. Making a set of measurements with the source and receivers located at different positions substantially increases the resolution capability of the system without increasing the number of sensors.

In a further aspect, the invention extends to a wide variety of usages to which the sensing arrays can be put. These include the detection of user positions and gestures as a means of conveying two- and/or three-dimensional information to, for example, computers, appliances, televisions, furniture, etc. The information is not limited to static measurements of mass distribution, position and/or orientation, but can extend to gestural information derived from changes in, for example, height and position. This information can represent data input or instructional commands to operate the device, or can instead be acquired by the device without user participation (to ensure, for example, safe operation based on the user's proximity to the device). On a larger scale, the invention can be used to sense proximity to a reference object for security purposes, to warn of danger, or to conserve energy by withholding power until a potential user approaches the object.

BRIEF DESCRIPTION OF THE DRAWINGS

The foregoing discussion will be understood more readily from the following detailed description of the invention, when taken in conjunction with the accompanying drawings, in which.

DETAILED DESCRIPTION OF THE PREFERRED EMBODIMENTS

1. Hardware Configurations

Figure 1A:
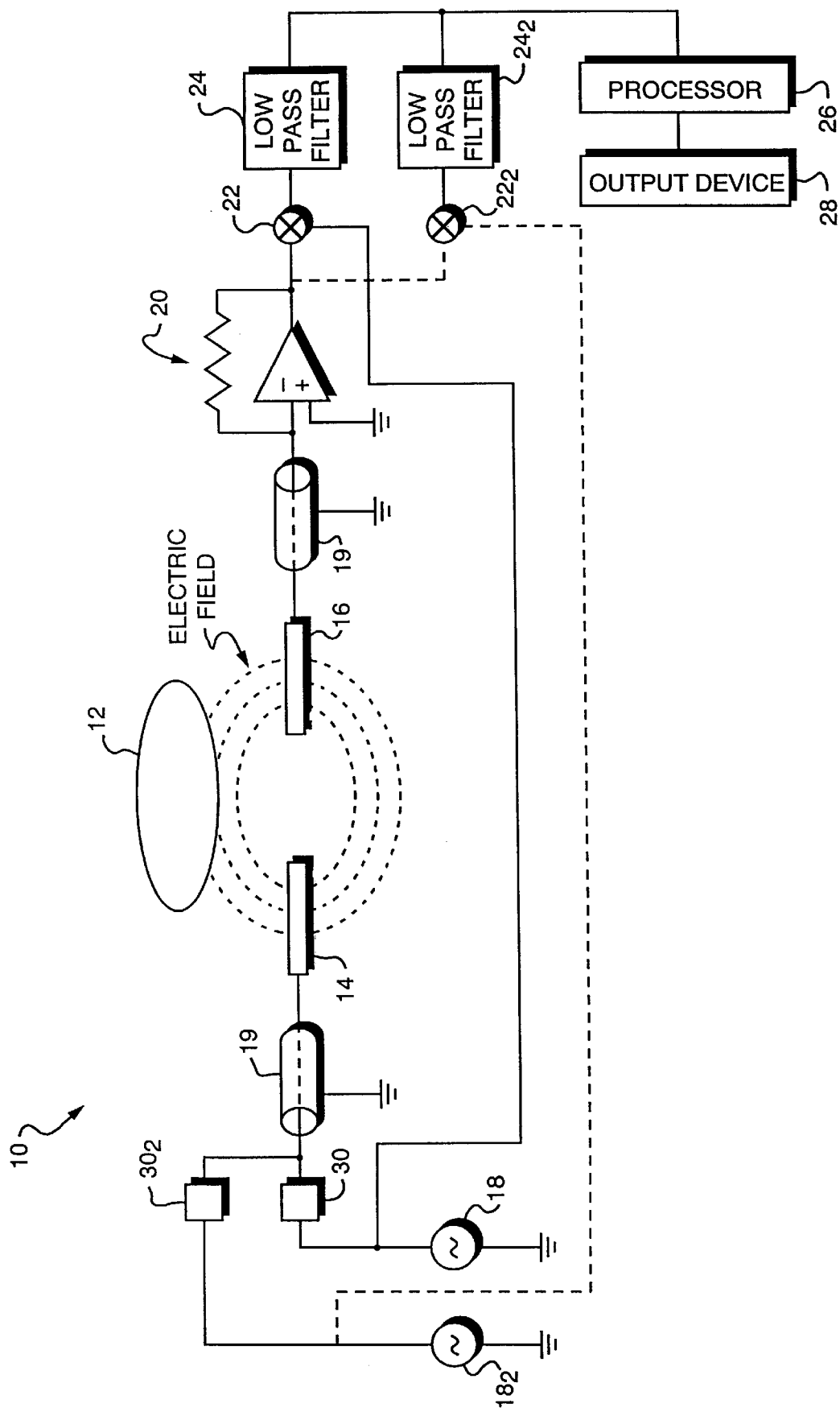
FIG. 1A is a schematic diagram of a sensor incorporating the invention.

Refer first to FIGS. 1–4, which illustrate representative hardware apparatus with which the present invention may be practiced. As shown in FIG. 1A, a simple position sensor 10 embodying the invention is arranged to sense a characteristic of an object 12 by detecting changes in the electric field involving an electrode pair comprising a sending electrode 14 and a receiving electrode 16. For example, the object 12 may be a human hand and the characteristic to be sensed is its position relative to the electrodes 14 and 16.

The sensor 10 includes an alternating-current (AC) source 18 connected between the electrode 14 and a reference point, i.e., ground, with a shielded cable 19 being used for the connection between the source 18 and the electrode 14. The electrode 16 is connected through a cable 19 to the inverting input terminal 20a of an operational amplifier 20. The amplifier is connected in a negative feedback circuit as shown. The terminal 20a is thus essentially at ground potential and the output voltage of the amplifier corresponds to the current from the electrode 16 to ground.

The output of the amplifier 20 is applied to a synchronous detector 22, whose other input is a signal from the source 18. Accordingly, the output of the detector 22 is the component in the output of the amplifier 20 that has the frequency and phase of the source 18. It is thus free of interfering signals and noise that may be picked up by the electrode 16.

The sensor 10 also includes a low-pass filter 24 which smooths the output of the detector 22. The signal from the filter 24 is applied to a computer 26, which includes an analog-to-digital converter (not shown) that converts the voltage from the filter to a digital value. The computer 26 uses the signal from the sensor 10 to drive an output device 28. The output device may, for example, be a meter calibrated in terms of a characteristic to be sensed; or a two-dimensional display that provides a graphical indication of a sensed characteristic; or any of the computer-related applications described below, which utilize the signal to obtain information from a user.

The frequency $f_1$ of the source 18 may be 100 kHz, and the relative spacing of the electrodes 14 and 16 of the order of 1 meter. In any case, the length of the electrode 14 and the spacing between electrodes are substantially less than a wavelength at the frequency $f_1$. Accordingly, there is minimal radiation from the electrode 14 and the coupling between the electrodes 14 and 16 is essentially capacitive.

As explained in greater detail below, the introduction of an object such as a human hand into the electric field extending between the electrodes 14 and 16 causes a reduction in the output voltage of the filter 24. This is contrary to what one might anticipate, since the presence of the hand in the field increases the capacitive coupling, between the electrodes 14 and 16, by changing both the effective geometry and the dielectric constant and thereby tending to increase the input current of the amplifier 20 and thus the output voltage of the filter 24. However, since the human body is electrically conductive, the presence of a hand provides a return path to ground through the body of the person, by way of the capacitances between the electrode 14 and the hand and between the rest of the body and ground. This diverts some of the displacement current that would otherwise flow from the electrode 14 to the electrode 16. With the depicted electrode configuration, an object in proximity to the electrodes 14 intercepts a substantial component of the electric field of the electrode pair, thus providing a significant decrease in the output current from the electrode 16.

The output voltage of the sensor 10 is a function of the frequency $f_1$ of the source 18 and the configuration and spacing of the electrodes 14 and 16, as well as such object-specific characteristics as position, configuration and composition. It will be apparent that any given output voltage can be the result of a number of different combinations of characteristics of the object 12. In some applications of the invention, such as use of the output voltage to trigger an event upon proximity of the object 12 to the electrodes, this ambiguity contributes to the usefulness of the sensor. On the other hand, in applications where the capabilities of the invention are best utilized, it is desirable to provide an output that is indicative of the position of the object 12, for example, when the sensing system is used to position a cursor on a display screen. It may also be desirable to discern the shape of the object, for example, to ascertain the presence of a human hand. In such situations it is preferable to use a sensor that employs multiple sending and/or receiving electrodes. Such a sensor is illustrated in FIG. 1B.

Figure 1B:
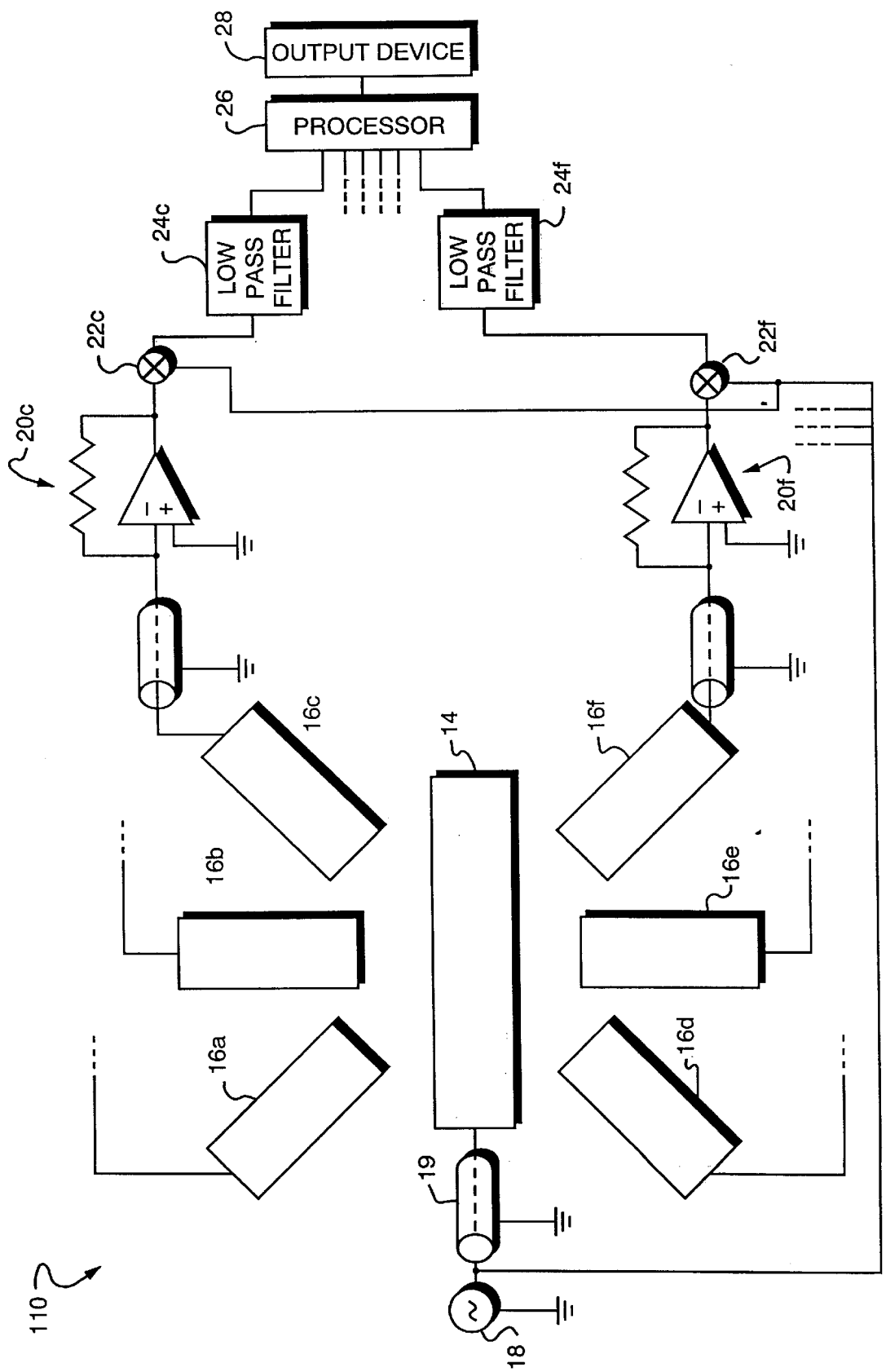
FIG. 1B is a schematic diagram of the sensor shown in FIG. 1 incorporated into a multiple-sensor arrangement.

More specifically, as shown in FIG. 1B, position sensor 110 has multiple receiving electrodes 16a–16f that share a single sending electrode 14. The electrodes 16a–16f provide the inputs for amplifiers 20a–20f and the outputs of the amplifiers are applied to synchronous detectors 22a–22f. The detector outputs, in turn, pass through filters 24a–24f to the computer 26. The computer 26 compares its inputs from the respective receiving electrodes 22a–22f to provide a relatively unambiguous indication of the lateral position of the object 12 (not shown in FIG. 2) and/or provide information about its shape. Also, by combining (e.g., summing) the inputs from the receiving electrodes, the computer can develop information covering the height of the object above the electrodes.

It will be apparent that the invention can be used to provide more three-dimensional information by using a three-dimensional distribution of electrodes. Moreover, multiple sets of sending and receiving electrodes can be used, with each electrode set operating at one or more frequencies different from those of the other sets.

It should be noted that the diversity furnished by the use of multiple sending and/or receiving electrodes can be provided, in part, by energizing one or more sending electrodes with multiple frequencies. Thus, with reference to FIG. 1, the electrode 14 can be connected to receive signals from both the source 18 and a second source $18_2$ having a frequency $f_2$. The sources 18 and $18_2$ are coupled to the sensing electrode 14 through isolation filters 30 and $30_2$, tuned to the frequencies $f_1$ and $f_2$, respectively. The output of the amplifier 20 is applied to a second synchronous demodulator $22_2$ connected to the sources $18_2$. The output of the detector $22_2$ is passed through a low-pass filter $24_2$, whose output in turn is fed to the processor 26. Since the output current from the electrode 16 is, in part, a function of frequency, the use of multiple frequency sources provides, in essence, multiple sending and receiving electrodes sharing common physical electrodes.

The use of multiple frequencies, either concurrently, as shown, or in a time-division multiplex arrangement also provides information about the electrical characteristics of the object 12 and thus can be used to distinguish a hand, for example, for an inanimate object. Specifically, measurement of the amplitude and phase of the output current from the receiving electrode as a function of frequency provides information about the composition of the object 12. The phase of the output current can be provided by adding a second phase detector with a quadrature input from the source 18.

Figure 2:
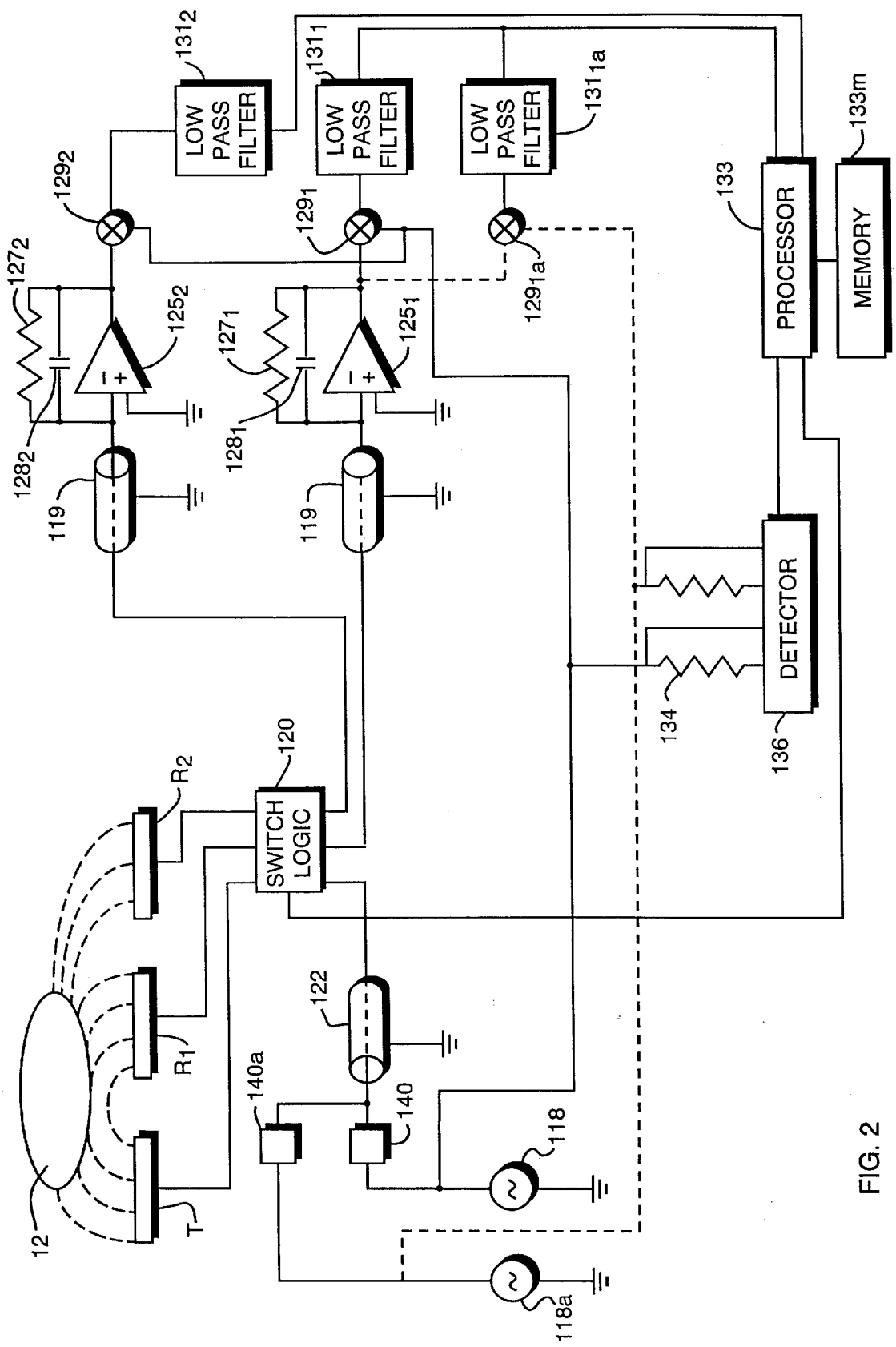
FIG. 2 is a schematic diagram of an alternative multiple-sensor arrangement in which any of the electrodes can be designated the transmitting electrode.

Refer now to FIG. 2, which illustrates the manner in which multiple circuits along the lines described above can be combined and their functions selectively and sequentially specified in order to obtain a set of measurements. Although three multifunctional electrodes are shown, it should be understood that the number of electrodes actually employed in a given implementation depends on the nature of the application. In the representative mode of operation shown in the figure, the electrodes include a sending or transmitting electrode T and a pair of receiving electrodes $R_1$, $R_2$. The characteristic to be sensed depends on the relative positions of the three electrodes (with respect to each other and to object 12), and the manner in which they are used.

The circuit includes components defining a transmitter stage, switchably coupled to transmitting electrode T, and a pair of receiver stages switchably coupled to receiving electrodes $R_1$, $R_2$. The transmission stage includes an alternating-current (AC) source 118 connected, by means of a switching logic circuit 120, between the electrode T and a reference point, i.e., ground, with a shielded cable 122 being used for the connections between source 118 and electrode T. Electrodes $R_1$, $R_2$ are also connected to the output side of switch logic 120 (by means of shielded cable 119), and the other two inputs to switch logic 120 originate with a pair of receiver stages switchably connected to electrodes $R_1$, $R_2$. Each receiver stage includes an operational amplifier $125_1$, $125_2$ connected in a negative feedback circuit. Thus, each of the two receiver input terminals is connected to the inverting input terminal of one of the amplifiers $125_1$, $125_2$. The inverting input terminals are thus essentially at ground potential and the output voltage of each of the amplifiers corresponds to the current from electrode T to ground.

A resistor $127_1$, $127_2$ and a capacitor $128_1$, $128_2$ bridge the non-inverting input terminal and the output terminal of each amplifier $125_1$, $125_2$, which are, in turn, each connected to a synchronous detector $129_1$, $129_2$, whose other input is a signal from source 118. Accordingly, the output of the detectors $129_1$, $129_2$ is the component in the output of amplifier $125_1$, $125_2$ that has the frequency and phase of the source 118. It is thus free of interfering signals and noise that may be picked up by the electrodes $R_1$, $R_2$.

The receiving stages each also include a low pass filter $131_1$, $131_2$ which smooth the output of detectors $129_1$, $129_2$. The signals from filters $131_1$, $131_2$ are applied to a computer processor 133, which includes an analog-to-digital converter (not shown) that converts the voltage from the filter to a digital value. The computer 133 controls switch logic 120, and utilizes the signals from filters $131_1$, $131_2$, as described below.

A resistor 134 is connected between the output of source 118 and one input terminal of a voltage detector 136, the other input terminal being connected directly to the output of source 118. In this way, detector 136 can be calibrated to measure the current output of source 118, and its output is provided to computer 133.

The frequency $f_1$ of source 118 may be 100 kHz, and the relative spacing of the electrodes depends on the characteristics being sensed. In any case, the length of the electrodes and the spacing between them are substantially less than a wavelength at the frequency $f_1$. Accordingly, there is minimal radiation from electrode T and the coupling to electrodes $R_1$, $R_2$ is essentially capacitive.

Figure 3:
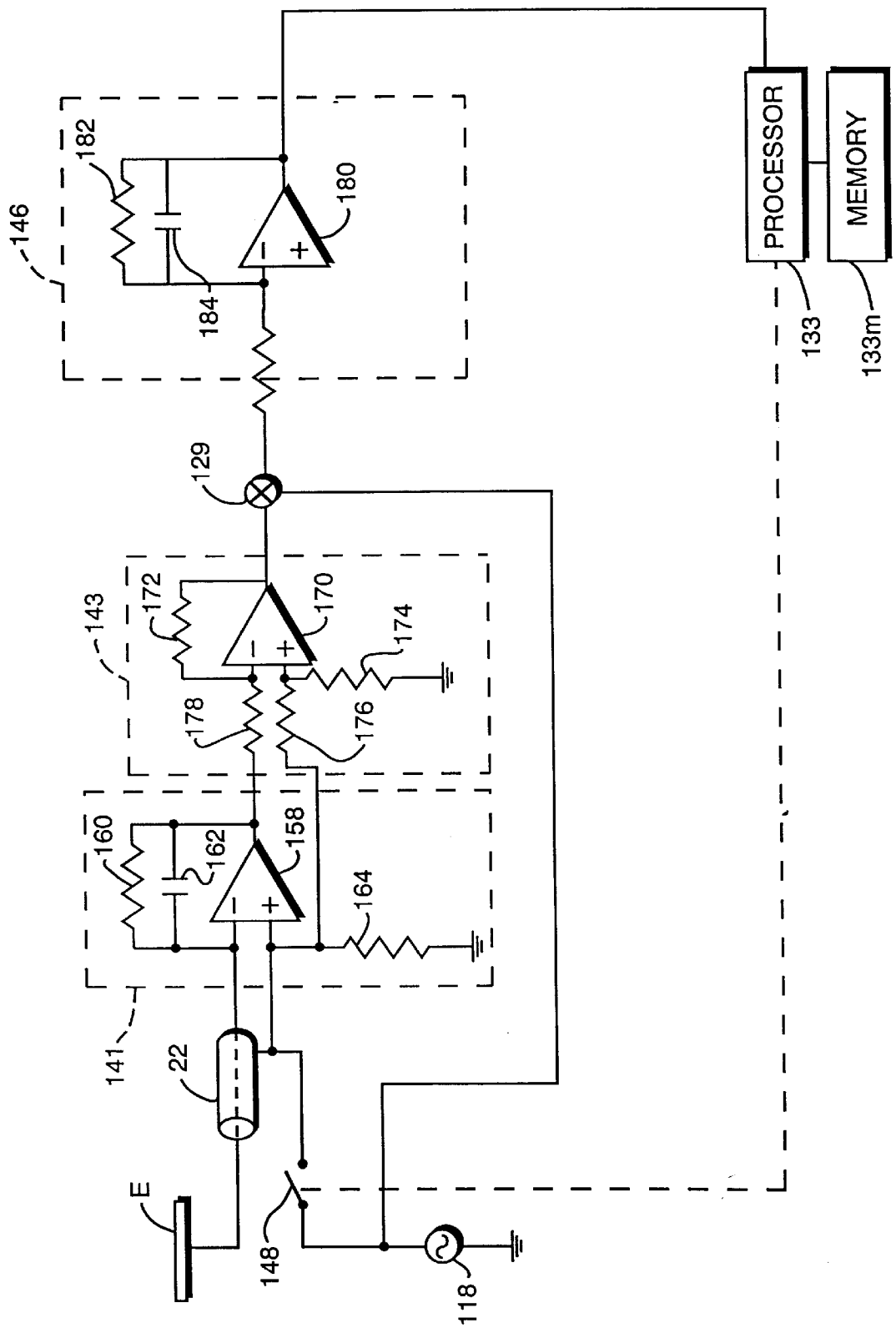
FIG. 3 is a schematic diagram of an alternative sensor design that can be employed as a receiver or a transmitter.

FIG. 3 illustrates an alternative arrangement that avoids the need for switch logic and separate receiver and transmitter stages. The circuit includes an electrode E, which can be a transmitting or receiving electrode; an AC source 118; a transimpedance amplifier 141 measuring current; a differential amplifier 143; a synchronous detector 129 whose input terminals are connected to the output of amplifier stage 143 and source 118; and a low-pass filter stage 146. A switch 148, controlled by computer 133, determines whether electrode E is a transmitting or receiving electrode.

Transimpedance amplifier 141 includes an operational amplifier 158, and a bridging resistor 160 and capacitor 162, which provide feedback. Capacitor 162 is included to compensate for stray capacitance (and resultant phase shifts) from the sensing capacitance (i.e., current capacitively received by electrode E, and may be approximately 10 pF. Bridging resistor 160 may have a value of about 100 kΩ, and a bias return resistor 164, which may have a value of about 1 MΩ, to roll off the DC response to account for the DC offset of the operational amplifier 158. It should be noted that capacitive feedback with a bias return resistor represents a design feature desirably applied to the circuits shown in FIGS. 1A and 1B.

Differential amplifier 143 includes an operational amplifier 170, a bridging resistor 172 (which may have a value of about 100 kΩ) and a leakage resistor 174 (which may have a value of about 1 MΩ). The amount of gain is specified by the ratio of the value of bridging resistor 172 to that of the resistor 176 into the non-inverting terminal of operational amplifier 170. Resistor 176 may have a value of 100 kΩ for a 10:1 gain ratio. For stability purposes it is preferred to include a resistor 178 into the inverting terminal, the value of which is equivalent to that of resistor 176. Amplifiers 158 and 170 can be physically located on electrode E to facilitate use of ordinary wires carrying high-level signals, instead of shielded cable 22 with low-level signals.

Low-pass filter stage 146 includes an operational amplifier 180, and a bridging resistor 182 (which may have a value of 100 kΩ) and capacitor 184 (which may have a value of 10 pF).

In operation, closing switch 148 applies the signal from AC source 118 to electrode E (via feedback) causing the circuit to operate as a transmitter. The input to the second gain stage 143 is a voltage proportional to the current into electrode E, so the ultimate signal reaching computer 133 reflects a loading measurement.

Opening switch 148 decouples electrode E (but not detector 129) from AC source 118, so the signal into electrode E, which the other circuit components amplify and filter, originates externally (i.e., with a similar circuit behaving as a transmitter).

2. System Behavior

Figure 4:
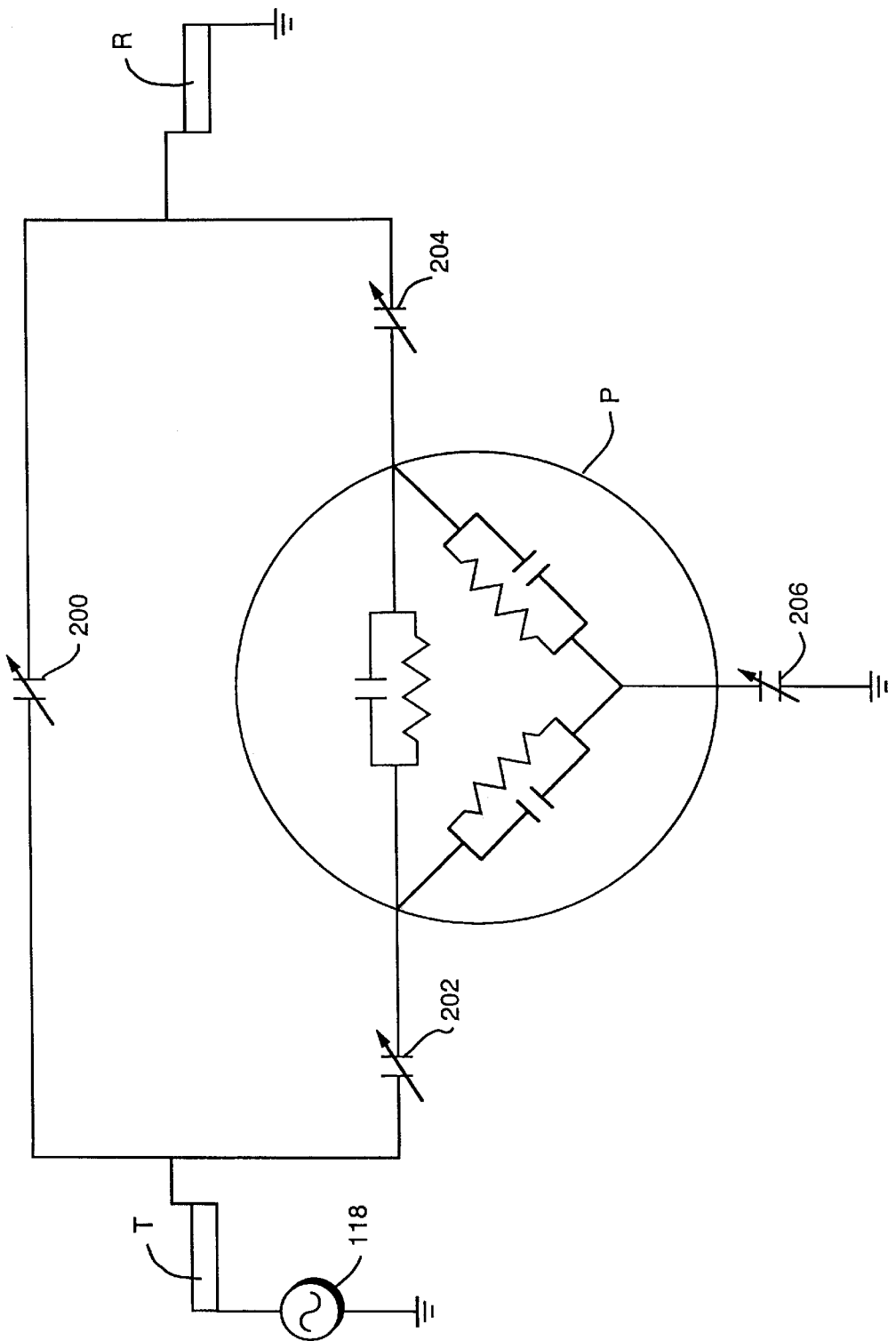
FIG. 4 illustrates the manner in which a sensed object or person affects the parameters measured by the invention.

The introduction of a person (or a person's limb or feature) into the electric field extending between, e.g., electrode T and electrodes $R_1$, $R_2$ may be understood with reference to FIG. 4, which models the various interactions in terms of an equivalent, hypothetical circuit. In the figure, the person P is represented as a three-terminal network, and current from AC source 118 (transmitted through a transmitting electrode T) can reach ground via any of three current paths: through a first variable capacitor 200 connected to a receiving electrode R (spaced some distance from electrode T and connected to ground); through a pair of variable capacitors 202, 204 on either side of network P and then to electrode R; or directly through network P and a fourth variable capacitor 206. The values of the various hypothetical capacitors in the circuit depends on the relative distances between the electrodes R, T and the person P, and the circuit assumes that person P is positioned within the space defined by the electrodes.

The capacitor 200 represents capacitive coupling solely between the electrodes, as if they were the two plates of a single capacitor. Without the person P, this capacitance would predominate; when introduced, however, person P, who is electrically conductive, "steals" flux from the electric field between the two electrodes and conducts it to ground via capacitor 206, but also increases the capacitive coupling between the electrodes by changing both the effective geometry and the dielectric constant; this increase in capacitive coupling is represented by the capacitors 202, 204.

In "loading" mode, current into receiver electrode R is inconsequential or ignored for measurement purposes; the only relevant current is that exiting electrode T, regardless of how it reaches ground. For example, if electrode R is very far from both electrode T and person P, which are proximate to one another, the dominant capacitances will be those at 202, 206, and the current exiting T—as measured, in FIG. 2, by detector 136—will essentially equal the current through person P.

If, however, the electrodes are spaced more closely, the electric field between them is stronger, and the other capacitances become more significant; their relative significances, of course, depend on the length scale and position of person P with respect to the electrodes. If person P is very close to electrode T, the person's body is effectively clamped to the AC source, so it oscillates at the transmission voltage. In this "transmit" mode, capacitance 202 is therefore very large relative to capacitances 202, 204. Because AC source 118 is configured to deliver a constant voltage, the increase in capacitance 202 as person P approaches electrode T forces AC source 118 to put out more current (which can be detected by a "loading mode" measurement) in order to maintain the constant voltage. This results in greater current at electrode R, the amount of the increase depending on the ratio of capacitance 206 to capacitance 204 (the magnitude of capacitance 204, in turn, depending on the distance between the person P and electrode R).

When there is some distance between person P and both electrodes, capacitance 206 is overwhelmed neither by capacitance 202 nor capacitance 204, and therefore contributes to the current detected. In this "shunt" mode, some of the field is shunted to ground, and the effect of capacitance 206 is to reduce the current at electrode R. The shunted current is maximized when the person is situated halfway between electrodes T and R, since capacitances 202, 204 are thereby minimized (and capacitance 206 is assumed not to vary significantly with position); if the person P moves closer to either electrode, one of capacitances 202 and 204 will increase and the other will decrease, but the net effect is greater current into electrode R. Naturally, the shunting effect is increased to the extent person P's coupling to ground is improved (the limiting case occurring, for example, when person P touches a grounded wire).

These three cases, the distinctness of which has heretofore gone unrecognized in the art, represent the most extreme situations that may be encountered, and are therefore most easily interpreted in terms of signal measurements. For example, a high current out of electrode T and virtually no current into electrode R unambiguously locates person P proximate to or touching electrode T and far from electrode R. But most cases are intermediate, resulting in degeneracy. That is, the signal values cannot unambiguously characterize the location and orientation of person P, because those values can be produced by more than one unique location and orientation.

As discussed below, degeneracies can be resolved by by increasing the number of electrodes and/or the number of measurements. For example, by selectively connecting the AC source 118 to different ones of a set of electrodes, and measuring the current exiting the AC-coupled electrode and into the other electrodes, a matrix of measurements can be obtained. If each of n electrodes is employed as a transmitting electrode with current readings taken both from the transmitting and other electrodes, the matrix is square $$\begin{bmatrix} m_{11} & m_{21} & \cdots & \\ m_{12} & \ddots & & \\ \vdots & & & \\ & & & m_{ij} \end{bmatrix}$$

for i=j=n electrodes. The diagonal terms $m_{11} \ldots m_{ij}$ refer to measurements made in loading mode, i.e., the current out of the transmitting electrode; the entry $m_{21}$ refers to the current into electrode 2 when electrode 1 is the transmitter; and the entry $m_{12}$ refers to the current into electrode 1 when electrode 2 is the transmitter.

Accordingly, for n electrodes, all of which are capable of sending or receiving, it is possible to obtain n different loading-mode measurements and n(n−1)/2 different shunt-mode measurements (since the off-diagonal terms of the above matrix are symmetric about the diagonal assuming the absence of transmit mode). The situation is more complicated where transmit-mode measurements are allowed. In this case, there are fully n(n−1) distinct pairwise measurements, and $n^2$ distinct measurements altogether.

3. Forward Modeling

The ultimate aim of the invention is to work backward, or "invert" from a plurality of current-level readings to the mass distribution, position and/or orientation that elicited the readings. The manner in which sensed current varies with position and orientation depends on the type of measurement involved (which may itself be a function of the distance of the object from the electrodes) as well as the chosen electrode geometry; these same factors account for the degeneracy that must be broken in order to invert without ambiguity (at least with respect to a range of defined possible cases). Each additional electrode represents a weighting of the mass in the field that is independent (due to the nonlinearity of the response of the field to mass distribution). Thus, adding even one electrode substantially increases the number of cases that can be resolved. As a practical matter, this means that an initial configuration capable of distinguishing among many cases and failing only for a few can usually be extended to resolve the ambiguous cases through addition of a single electrode.

For simple cases, it is possible to develop an explicit, analytical forward model of the sensor response. Consider first the electrode arrangement depicted in FIG. 5. A transmitting electrode T and a receiving electrode R are coplanar (e.g., beneath a dielectric surface such as a tabletop); a user's hand is constrained to move between the electrodes along the x,y planar axes, or vertically, toward or away from a on the x,y plane 230 halfway between the electrodes, along the z axis. The hand can be validly approximated as a unit absorber having a small, fixed area, and the field geometry treated as a dipole. With these assumptions, and the assumption of shunt-mode measurements, movement along the plane between the electrodes can be represented by the function C−|E(x)|, where C is a constant and E(x) is a dipole field given by the gradient of the dipole potential $$\frac{p \cdot \hat{r}}{r^2}$$

Figure 6:
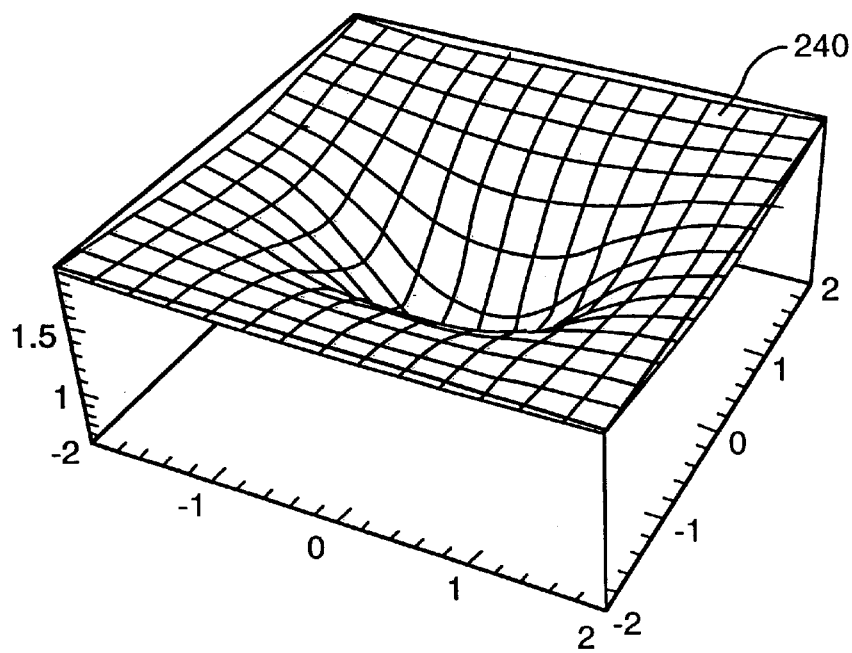
FIG. 6 graphically relates the output of the arrangement shown in FIG. 5 to two-dimensional movement between the electrodes.

($\hat{r}$ representing a unit vector in the direction of x, the position of the mass in space, and r representing the length of the vector from the origin to x). The dipole moment p is a constant representing charge multiplied by the vector from the center of electrode T to the center of electrode R. This function represents an explicit forward model, allowing the signal strength produced by the presence of the hand at any x,y position to be derived merely from knowledge of that position; a plot of this function, relating measured signal strength at electrode R to hand position, is shown at 240 in FIG. 6. Inversion cannot be accomplished unambiguously merely from this model, however, since, as shown by the figure, identical signal strengths can result from different positions (represented by any circular cross-section of the surface 240).

Figure 7:
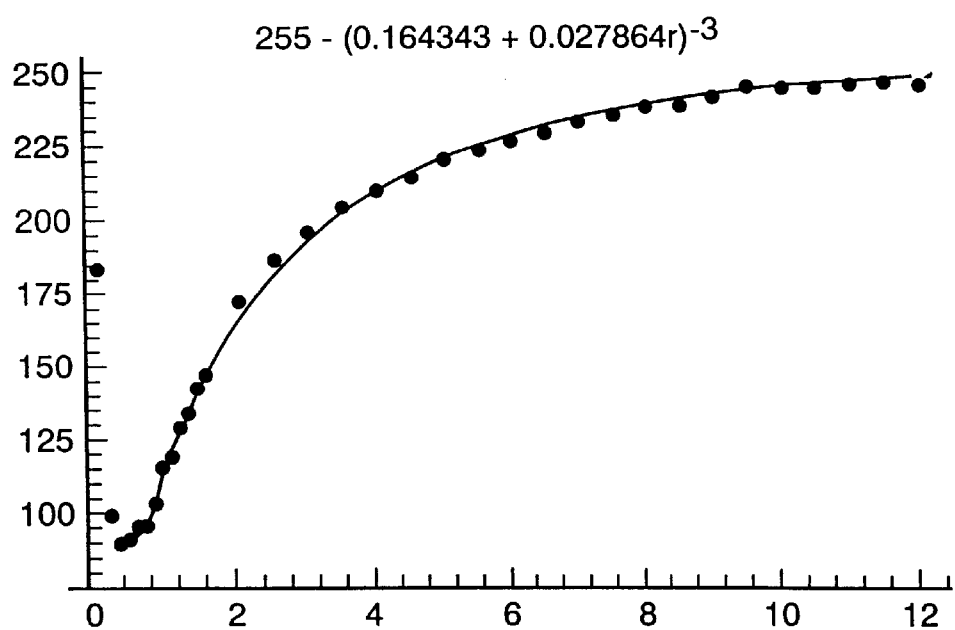
FIG. 7 graphically relates the output of the arrangement shown in FIG. 5 to movement toward and away from the plane of the electrodes.

Movement along the z axis can be represented in this model as $|E(x)|$ for $x=(0,0,z)=1/z^3$. The solid line in FIG. 7 shows a plot of this function, while dots represent experimental data. The model is not valid for very short distances, where transmit mode begins to dominate and the signal strength rises again. As a practical matter, the degeneracy produced by the intrusion of transmit mode can be eliminated either by physically preventing sufficient proximity of the object to the electrode so as to produce this behavior, or by switching the roles of the two electrodes and obtaining two separate measurements. If the detected current levels at each electrode are not consistent with one another according to the shunt-mode model, then one of the readings will be attributable to transmit mode.

Figure 8:
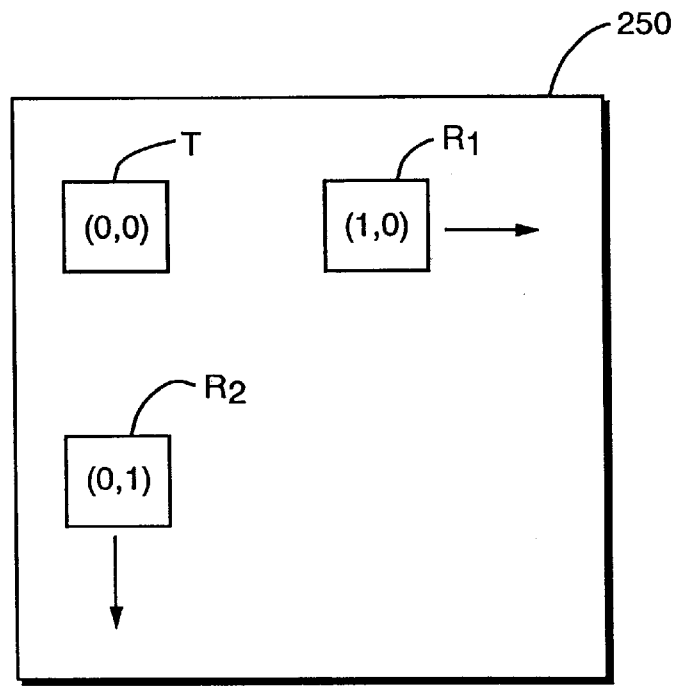
FIG. 8 depicts a three-electrode sensing arrangement suited to resolving two-dimensional and some three-dimensional position information.

Consider now the arrangement shown in FIG. 8. A transmitting electrode T and a pair of receiving electrodes $R_1$, $R_2$ are arranged on a planar surface 250 with the center of electrode T at the origin (0,0) and the centers of electrodes $R_1$, $R_2$ disposed equidistantly from T at a right angle, their positions being represented by arbitrary units (1,0), (0,1). This arrangement facilitates locating a mass in the portion of plane 250 within the arrows, or above this area. Using the coordinate units shown and assuming a point absorber and shunt-mode coupling, the signal strength at electrode $R_1$ can be modeled as:

$$E(R_1) = \left( \frac{9(-0.5+x)^2 y^2}{((-0.5+x)^2+y^2+z^2)^5} + \frac{9(-0.5+x)^2 z^2}{((-0.5+x)^2+y^2+z^2)^5} + \left[ \frac{-3(-0.5+x)^2}{((-0.5+x)^2+y^2+z^2)^{5/2}} + ((0.5+x)^2+y^2+z^2)^{-3/2} \right]^2 \right)^{1/2}$$

and the signal strength at electrode $R_2$ can be modeled as:

$$E(R_2) = \left( \frac{9x^2(-0.5+y)^2}{(x^2+(-0.5+y)^2+z^2)^5} + \frac{9(-0.5+y)^2 z^2}{(x^2+(-0.5+y)^2+z^2)^5} + \left[ \frac{-3(-0.5+y)^2}{(x^2+(-0.5+x)^2+z^2)^{5/2}} + (x^2+(0.5+y)^2+z^2)^{-3/2} \right]^2 \right)^{1/2}$$

Generally, this electrode arrangement is best suited to two-dimensional measurement, and z is set at a constant value representing the working height. It should be noted that holding $E(R_1)$ or $E(R_2)$ is constant defines a two-dimensional surface in space.

Figure 9:
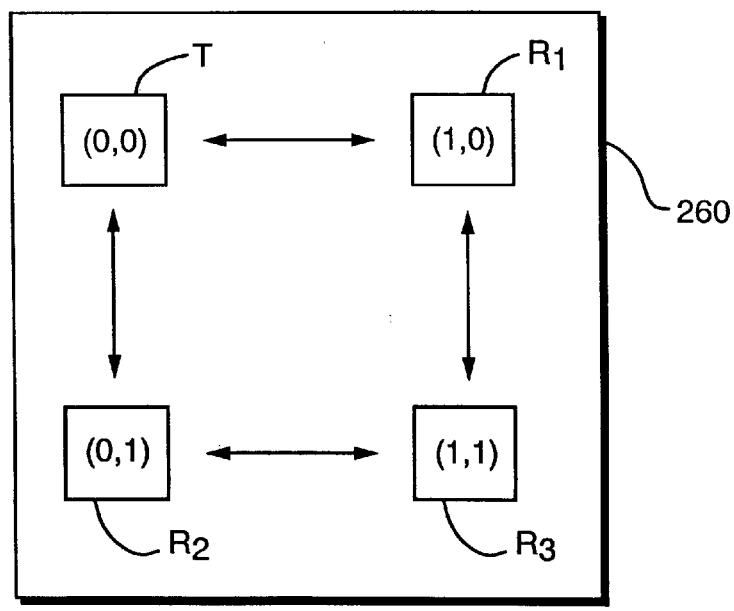
FIG. 9 depicts a four-electrode sensing arrangement suited to resolving two- and three-dimensional position information.

The arrangement shown in FIG. 9 can be used to provide three-dimensional position information on or above the plane 260 within the boundaries shown by the arrows. The magnitudes of the electric fields at receiving electrodes $R_1$, $R_2$ are given as set forth above; the electric field at $R_3$ (again assuming shunt-mode coupling and a point absorber) is given by:

$$E(R_3) = \left[ \left( 1 - 4x + 7.25x^2 - 6.5x^3 + \frac{5x^4}{2} - 4y + 9.5x^2 y + 3x^3 y + 7.25y^2 - 9.5xy^2 + 5x^2 y^2 - 6.5y^3 + 3xy^3 + \frac{5y^4}{2} + 2.5z^2 - 5xz^2 + \frac{7x^2 z^2}{2} - 5yz^2 + 3xyz^2 + \frac{7y^2 z^2}{2} + z^4 \right) \Big/ (0.5 - x + x^2 - y + y^2 + z^2)^5 \right]^{1/2}$$

More generally, for any type of measurement, there will be a surface in space where the received signal will be constant for a given object, regardless of the position of the object on the surface. This condition is, of course, insufficient in itself to ensure reliable inversion. The distance between the centers of a sending and a receiving electrode determines the shape of the electric field that is interrupted by the sensed object. Thus, for example, in a two-electrode system a large object far away from the electrodes intercepts the same number of field lines as a closer but smaller object, and the sensed current in both cases will be equivalent. But "iso-signal shells" are important components, as will become apparent, in a fuller analysis.

In loading mode, the detected signal falls off inversely with distance from the transmitting electrode at relatively close distances (i.e., where the transmitting electrode plate and the sensed object cooperate essentially as a parallel-plate capacitor) and inversely with the distance squared at far distances (i.e., where the transmitting electrode plate and the sensed object behave essentially as points). The iso-signal shell of a loading-mode measurement, therefore, is a sphere for electrodes that are spherically symmetric or validly considered pointlike. (For electrodes having an arbitrary shape, the iso-signal shell will reflect that shape.) The sphere can be considered to have a "thickness" corresponding to the degree of noise (generally additive Gaussian noise) in the system. In other words, given a loading-mode measurement, the most likely position of the sensed object is at the center of the shell thickness, with noise introducing an uncertainty that falls off toward the inner and outer shell surfaces (which themselves represent arbitrarily low, noise-generated uncertainty levels). Again, an iso-signal sphere is relevant only to a particular object; a large object can produce the same sensed current as a small object located closer to the transmitting electrode, but the larger object's iso-signal sphere will have a greater diameter than that of the smaller object.

The iso-signal shell of a shunt-mode measurement is roughly an ellipsoid whose foci are the centers of the transmitting and receiving electrodes. The equations given above describe these ellipsoids for constant values of E.

Forward modeling of more complex electrode and object arrangements typically requires elaborate mathematical treatment. Essentially, Laplace's equation $\nabla^2 \phi_0 = 0$, which represents the most general forward model, must be solved for every possible object position in the working space; in other words, with the field fully characterized for any arbitrary distribution of mass, sensor readings can be predicted for any arrangement of sensor locations. This is clearly feasible, although computationally costly and, depending on the geometry involved, perhaps analytically impossible. In cases where the equation has no closed-form solution, numerical analysis techniques such as successive overrelaxation or an alternating-direction implicit method can be utilized. Alternatively, the forward model can be empirically determined from actual measurements (e.g., by function fitting to a meaningful number of measured values each corresponding to known mass parameters). Obviously this approach becomes less attractive with increasing numbers of parameters to be determined, since the amount of data required grows as a power of the number of unknown parameters.

The concept of iso-signal shells can, however, be used to simplify forward modeling in situations where at least something is known about the mass to be characterized; that is, the forward model can be used to distinguish among possible "cases" or instance categories differing by identifiable unknown parameters. Moreover, because each sensor measurement represents a projection weighted by the nonlinear field distribution, the response of an electrode to mass distribution is itself nonlinear. As a result, the information provided by each measurement is fully independent, so that adding a single receiving electrode (or transmitting/ receiving electrode pair) is generally sufficient to fully resolve an additional degree of freedom—e.g., an independent parameter associated with an instance category.

For example, consider a single electrode capable of making measurements in loading mode and a conductive mass whose size and shape are known, and which is constrained to move along an axis. In this case, so much is already known about the mass that a single loading-mode measurement is sufficient to locate it along the axis. But suppose that the precise size of the object is not known; instead, it is either large (e.g., 1 meter in diameter) or small (e.g., 1 cm in diameter). This introduction of this single new parameter—large vs. small—prevents a single electrode from locating the object unambiguously, since the signal from a proximately located small mass is identical to that of a distant larger mass. A single additional electrode, however—even one confined to loading-mode measurements—will resolve between these two cases, since only one solution can account for the signal levels observed at both electrodes; geometrically, the solution occurs where two iso-signal shells from among the continuum of possible shells intersect at a point. (On the other hand, as explained in greater detail below, two such such electrodes generally are not adequate to select among a continously variable range of sizes.)

This strategy of resolving a degree of freedom (i.e., an independent variable) through addition of a single new measurement is valid so long as the field distribution is not symmetric with respect to the mass being measured. For example, with reference to the electrode arrangement shown in FIG. 5, suppose the mass is located along the z axis and is symmetric about that axis (e.g., is spherically shaped), equidistant between electrodes R and T. In this case, loading-mode measurements from both electrodes will not enhance the information already obtainable from either electrode in isolation, since the length scale is invariant. However, the field distribution of a shunt-mode measurement is distinct from that of a loading-mode measurement, so the combination of a single loading-mode measurement and a single shunt-mode measurement will once again distinguish the two cases. So long as an electrode pair is free to operate in loading or shunt mode, the addition of a single electrode is generally adequate to fully resolve an additional degree of freedom. (Indeed, in theory, an additional electrode can resolve as many as n additional degrees of freedom, where n is the total number of electrodes, since the new electrode is used in conjunction with the existing electrodes.)

Figure 5:
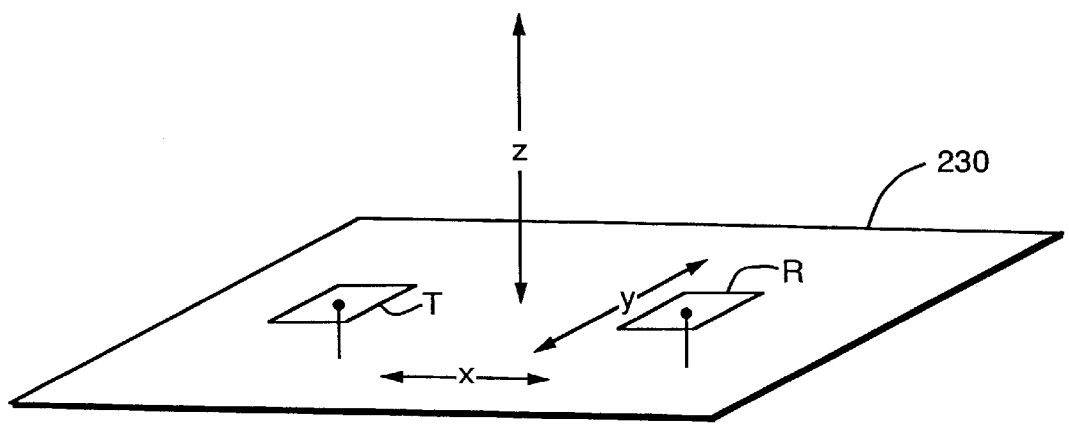
FIG. 5 depicts a two-electrode sensing arrangement capable of resolving certain position and height information.

The two-electrode arrangement shown in FIG. 5, therefore, can distinguish between a large and a small mass constrained to movement along the z axis. If, however, the mass is also free to move within the x-y plane, its three-dimensional position cannot be unambiguously localized by two electrodes, since field distributions resulting from z-axis movement will be symmetric (in the illustrated two-electrode system) with respect to x-y movements. Adding a third electrode (e.g., as shown in FIG. 8) disrupts this symmetry and thereby resolves the ambiguity, facilitating distinction between a large and a small object in three dimensions. Importantly, the location of the third electrode is not critical so long as the object remains in the sensing field defined by all three electrodes.

Similarly, if the mass is known to be spherical and traveling along the z axis but of unknown (and continuously variable) radius, the third electrode will resolve the radius parameter along with z-axis position. A fourth electrode will resolve radius and position in three dimensions. The same will be true if the mass is not spherical but has effective spherical symmetry (e.g., a mass that can be validly approximated as a point given the length scale of measurement), or has a known shape and orientation (so that the only undetermined parameters are position and size).

Figure 11:
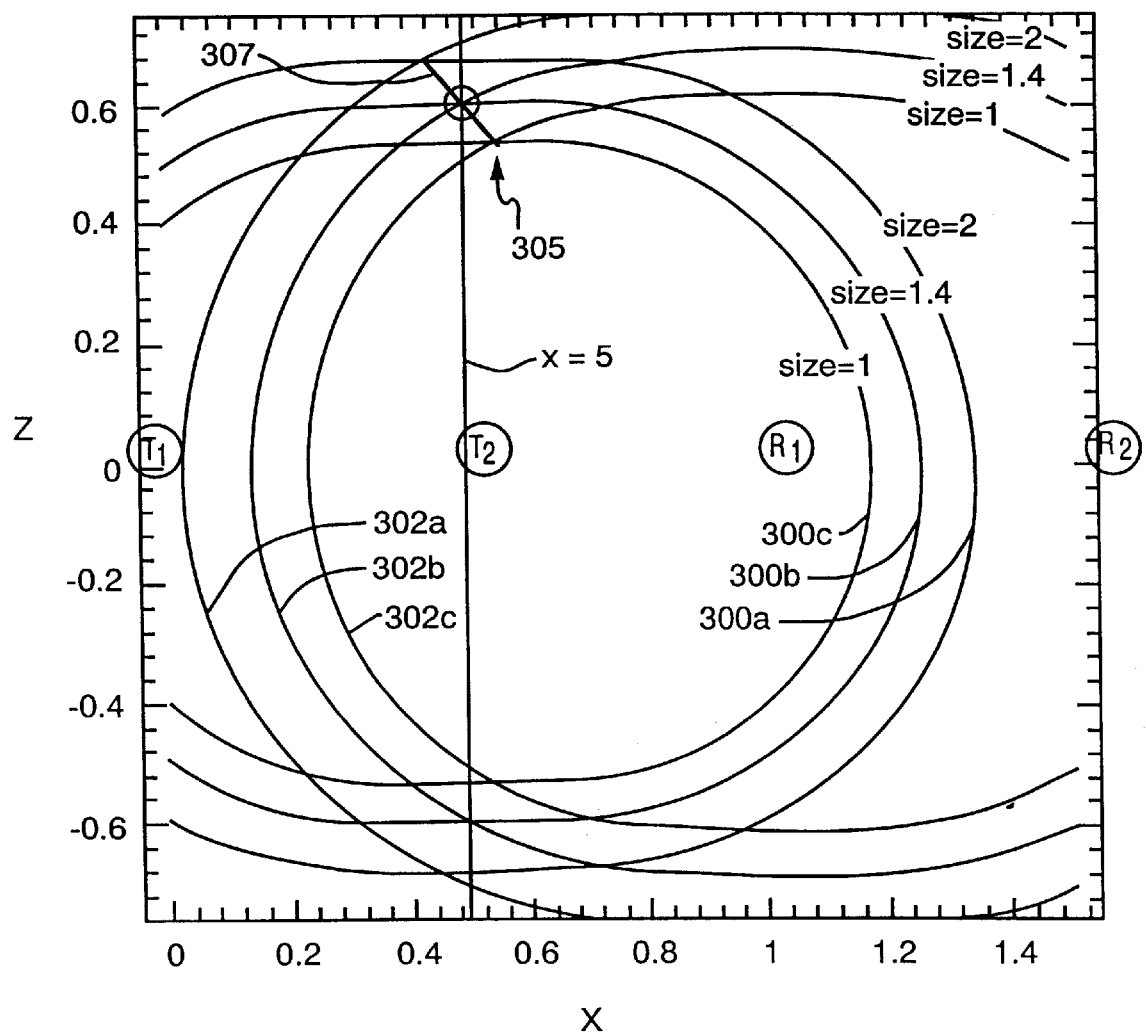
FIG. 11 illustrates the manner in which readings can be combined with known constraints to solve for an unknown parameter.

An example of this approach is shown in FIG. 11, where a spherical mass of unknown size is constrained to z-axis movement at a known x-axis location (x=0.5). Transmitting electrodes $T_1$, $T_2$ are located at (x=0, z=0) and (x=0.5, z=0), respectively, and receiving electrodes $R_1$, $R_2$ are located at (x=1, z=0) and (x=1.5, z=0), respectively, and may be used to determine both the z-axis location and size of the mass. The sensed signal levels at $R_1$, $R_2$ are each associated, according to the forward model, with a set of iso-signal shells corresponding to different mass sizes. Representative ones of these are illustrated cross-sectionally at 300a, 300b, 300c with respect to the $T_1/R_1$ electrode pair, and at 302a, 302b, 302c with respect to the $T_2/R_2$ electrode pair. For purposes of illustration, shells 300a, 302a are assumed to correspond to a mass radius of 2.0 arbitrary units, shells 300b, 302b to a mass radius of 1.4, and shells 300c, 302c to a mass radius of 1.0.

The mass must be located where the iso-signal shells intersect; assuming a positive z location localizes the mass to the spatial region of intersection denoted at 305. Furthermore, because the size of the mass remains consistent for each set of iso-signal shells, only the linear regions of contact between shells corresponding to equally sized masses are relevant, so the mass must lie along the diagonal line 307. Finally, the z-axis constraint localizes the mass at the intersection of line 307 and x=0.5, revealing its size to be 1.4.

This approach can be extended to resolving orientation of a mass that is not radially symmetric but whose shape is known. Thus, if the mass has axial symmetry (e.g., is shaped as an ellipse whose major axis is parallel to the x-y plane), four electrodes defining a sensing field occupied by the mass will be sufficient to resolve its orientation, size and distance from the x-y plane. A fifth electrode will resolve these parameters with the major axis free to move transversely to the x-y plane. Six electrodes can resolve the x,y,z spatial position, as well as the orientation (expressed, for example, in terms of roll, pitch and yaw deviation from a reference orientation) of an asymmetric object such as a hand; a seventh electrode can resolve size.

The foregoing examples assume, for simplicity, that each electrode is either a receiving electrode or a transmitting electrode, so that each electrode resolves an additional degree of freedom. As explained earlier, it is the addition of a new independent measurement, rather than a new electrode, that is responsible for the additional resolution. Accordingly, the number of electrodes actually needed for a given application can be reduced by multiplexing—that is, by alternating electrode roles to produce additional measurements rather than using a fixed set of transmitting and receiving electrodes. So long as the spatial arrangement of the electrodes and the mass does not result in degeneracy-producing symmetries, an additional independent measurement will be produced each time a receiving electrode becomes a transmitting electrode and vice versa, thereby resolving an additional degree of freedom.

These examples also assume some knowledge concerning the shape of the object being sensed, i.e., its mass distribution. Indeed, the forward modeling techniques set forth above can be viewed as a progression from the simple problem of locating the position of a point absorber to resolving the position as well as the orientation of a more complex mass of known shape. Resolving shape without prior knowledge represents the final destination along this spectrum. Unfortunately, because this characteristic represents a many-valued parameter having potentially infinite degrees of freedom, it cannot generally be solved simply by adding a single electrode. Approached analytically, a full characterization of mass distribution represents an imaging problem, with increasing number of sensors enhancing the resolution with which the volumetric shape of a mass can be imaged.

We have found, however, that this "brute force" method can be circumvented through use of the iso-signal approach to forward modeling combined with judicious application of constraints. In particular, at least one parameter relevant to volumetric shape or mass distribution is specified (generally within a defined range) in advance. This knowledge is used to constrain possible solutions in a systematic fashion, so that the minimum number of electrodes necessary to resolve mass distribution to a desired resolution can be employed. Suppose, for example, that the size of an arbitrarily shaped mass to be characterized is known to fall within a range $S_1 \to S_2$. Regardless of measurement mode, this constraint localizes the entire object in the spatial region between iso-signal shells corresponding to $S_1$ and $S_2$. Information is developed very rapidly as further electrodes are added to the system, because each new electrode can define numerous additional spatial restrictions concerning the mass: the spherical "thickness" regions between size-limited loading-mode iso-signal shells (each of which itself has a much smaller noise-related thickness, as discussed above), and the ellipsoidal thickness regions between size-limited shunt-mode measurements coupling the new electrode to each pre-existing electrode. And because all of these spatial restrictions are independent and must be simultaneously satisfied by the mass, even relatively complex volumetric shapes and mass distributions frequently can be resolved with only a few electrodes capable of shunt-mode and loading-mode measurement.

This approach is implemented by defining a probability function whose value is positive in the region between the iso-signal shells and zero outside this region, i.e., a step function. A suitable function for one electrode is given by $$\left[\frac{1}{1 + e^{-\beta(f(p,s_{min})-D)}}\right]\left[\frac{1}{1 + e^{-\beta(D-f(p,s_{max}))}}\right]$$

where the first term corresponds to the inner iso-signal shell and the second term to the outer shell, each term defining a step function and their product providing a "top hat" function that is positive over the appropriate spatial regions; f(p,s) is the data value predicted by the forward model f given the x,y,z position p of a point absorber and a size parameter s as discussed below; $s_{min}$ and $s_{max}$ are the size parameters associated with the inner and outer shells, respectively; D is the observed signal value from the electrode; and β is a sharpness parameter whose value is straightforwardly chosen based on considerations of efficiency and imaging resolution. Each of the two terms varies from 0 to 1, with a value of 0.5 (assuming β=1) corresponding to locations along the inner and outer shells themselves.

The function steps occur where the object is as small or as large as allowed; consequently, the forward model includes a size parameter s whose value in the first function term allows that term to specify a minimum size, and whose value in the second term reflects a maximum size. Values of f(s,p) less than the observed signal—that is, within the inner shell—rapidly decrease the value of the first term, while values of f(s,p) greater than the observed signal—that is, outside the outer shell—rapidly decrease the value of the second term. Values less than 0.5 are treated as zero values. Thus, solving the forward model f for any point in space facilitates determination of whether that point lies in the region between boundary iso-signal shells. It is not necessary to solve Laplace's Equation for all points simultaneously.

A composite probability function for all electrodes in the system is defined by the product of the functions associated with the electrodes individually. An image of desired resolution can be generated by solving the composite functions on a point-by-point basis for the relevant spatial region. In practice, the function is resolved such that its only unknowns specify spatial position, and the function is sequentially solved for the positions of candidate points. Typical three-dimensional imaging systems represent image points as an ordered list of "voxels" each specifying color, brightness and three-dimensional position. Voxels are "turned on" where the composite probability is positive and "turned off" where it is zero, resulting in a displayable volumetric image approximating the mass.

4. Inversion

The existence of an analytical solution to the forward modeling problem does not guarantee simple solution to the inverse problem, since the inverse to a complex analytical equation frequently is not itself a closed-form equation. That is, given a set of sensor readings, it is frequently not possible to directly and unambiguously solve for the size, mass distribution, position or orientation that accounts for those readings. In these cases, techniques of error minimization or probability maximization are employed.

Error minimization involves solving the forward model for an arbitrary set of parameters, and iteratively processing by modifying the parameters until the sensor readings predicted by the forward model approximate the actual sensor readings with the least error. Representative error-minimization techniques include the Nelder-Mead (or "Downhill Simplex") method and the conjugate-gradient method, and the manner in which these can be applied to the present invention is well within the purview of one skilled in the art.

In the probabilistic approach, inversion is viewed as an inference problem. The forward model contains parameters whose values account for the observed sensor readings, and a probability distribution is defined over those parameters. As more data becomes available (e.g., as the outputs of more receiving electrodes are considered), the volume of the feasible set of model parameters consistent with the observed outputs (the "ambiguity class") decreases and the probability distribution becomes increasingly peaked around the "true" or most likely values of the parameters.

Since the receiving electrodes are subject to additive Gaussian noise, the probability of the output data given some arbitrary setting of the model parameters is given by:

$$p(D|m) = \frac{1}{\sqrt{2\pi}\,\sigma} e^{-\frac{(D-f(m))^2}{2\sigma^2}}$$

where $\sigma$ is the standard deviation, D is an output measurement datum, and f(m) is the data value predicted by the forward model given a model configuration (e.g., hand position) m. This distribution is normalized: integration over all values of D equals 1. Bayes' theorem facilitates inversion as follows:

$$p(m|D) = \frac{1}{\sqrt{2\pi}\,\sigma} \frac{e^{-\frac{(D-f(m))^2}{2\sigma^2}} p(m)}{p(D)}$$

For the cases of two- or three-dimensional sensing, a prior probability p(m) can be chosen to render the inversion well-posed (e.g., in a mouse implementation, by restricting the possible hand positions to positive coordinate values). A useful prior probability for one of the model parameters is $$p(m) = \frac{c}{1 + e^{-\beta x}}$$

for m=x, where x is a spatial position, c is a normalizing constant and $\beta$ is a sharpness parameter. This function facilitates approximation of a step function with a closed-form expression. A possible advantage of this function over a hard step function lies in the ability of numerical optimization techniques to follow it back into the high-probability region, since it is smoothly varying. The overall prior probability is the product of the priors for x, y and z. In the case of x, $$p(m|D) \propto e^{-\frac{(D-f(m))^2}{2\sigma^2}} \frac{c}{1 + e^{-\beta x}}$$

Apart from the prior probability, which in some cases can be validly represented as a constant over some spatial region of interest, the functional form of the forward probability p(m|D) is identical to that of the inverse probability, p(D|m). This similarity can, however, be misleading. For example, the formula for inverse probability is set forth as a proportionality. It may be useful to normalize p(m|D) and thereby obtain a specific probability level. Although this is not important for finding the best setting of the model parameters, since a scaling of the dependent variable (probability) has no effect on the location of maxima, normalization can prove useful in to facilitate assigning a confidence level to a set of model parameters, when making any sort of comparison among different functions f, or when calculating entropies (as discussed below). Rather than performing the simple Gaussian integral over D (simple and Gaussian because, when integrating p(D|m), m and therfore f(m) are fixed), it is necessary to integrate over all values of m, which means integrating the forward model composed with a Gaussian. The difficulty of performing this integration depends on the form of f. Fortunately, for small $\sigma$, p(m|D) can be well approximated by a Gaussian, which is easily integrated.

Information obtained from multiple receiving electrodes can be combined into a composite probability function by combining the individual probabilities p(m|D). This is accomplished by by multiplying the p(m|D) terms associated with each receiving electrode to obtain the joint probability of a complete model given all the available data:

$$p(m|D) \propto \prod_i^N e^{-\frac{(D_i-f_i(m))^2}{2\sigma^2}} \prod_j \frac{c}{1 + e^{-\beta x_j}}$$

where D denotes the set of N measurements and i indexes the receiving electrode. In this way, the information obtained from multiple sensors is utilized in combination to constrain the set of optimal model parameters m and thereby facilitate a spatially unambiguous (i.e., non-degenerate) inverse solution.

This is demonstrated in connection with the electrode arrays shown in FIGS. 8 and 9. In the case of the two-dimensional measurement array of FIG. 8, the position of an object is sought to be inferred in two dimensions from two sensor readings. So the model consists simply of two numbers, representing the position of the object purported to explain the sensor readings.

Figure 10A:
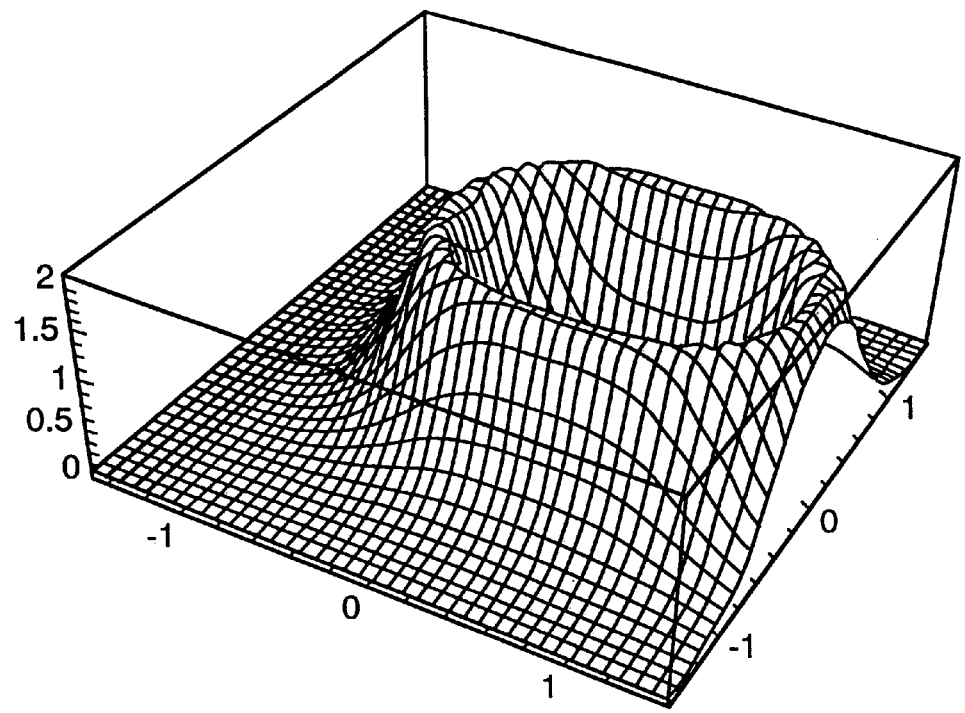
FIGS. 10A and 10B show forward probability distributions for each receiving electrode in the arrangement shown in FIG. 8, given an object in the sensed region.
Figure 10B:
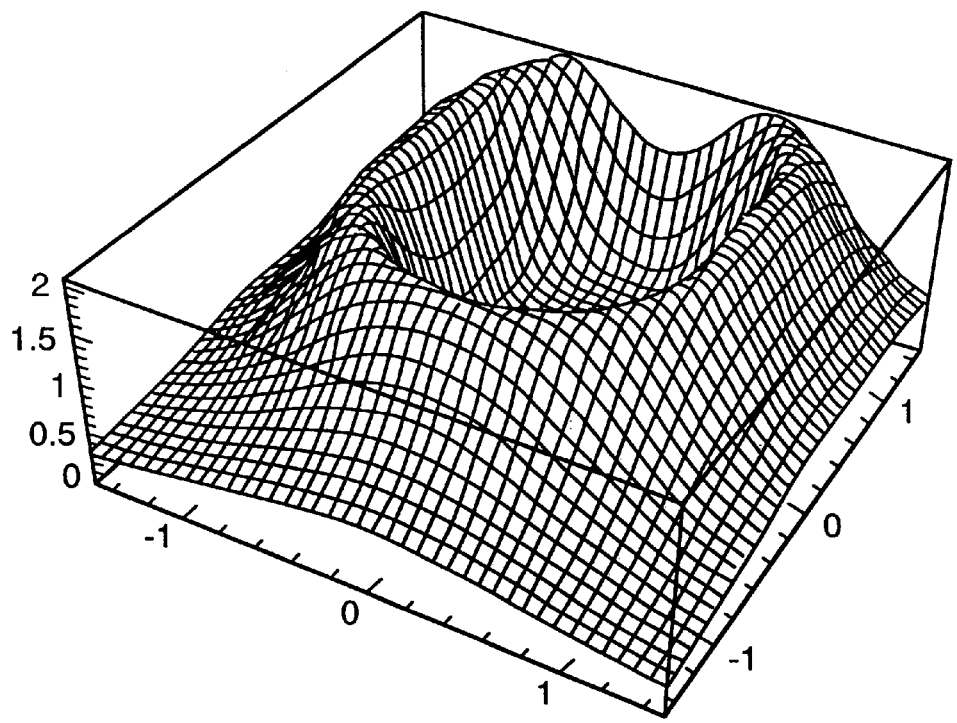
Figure 10C:
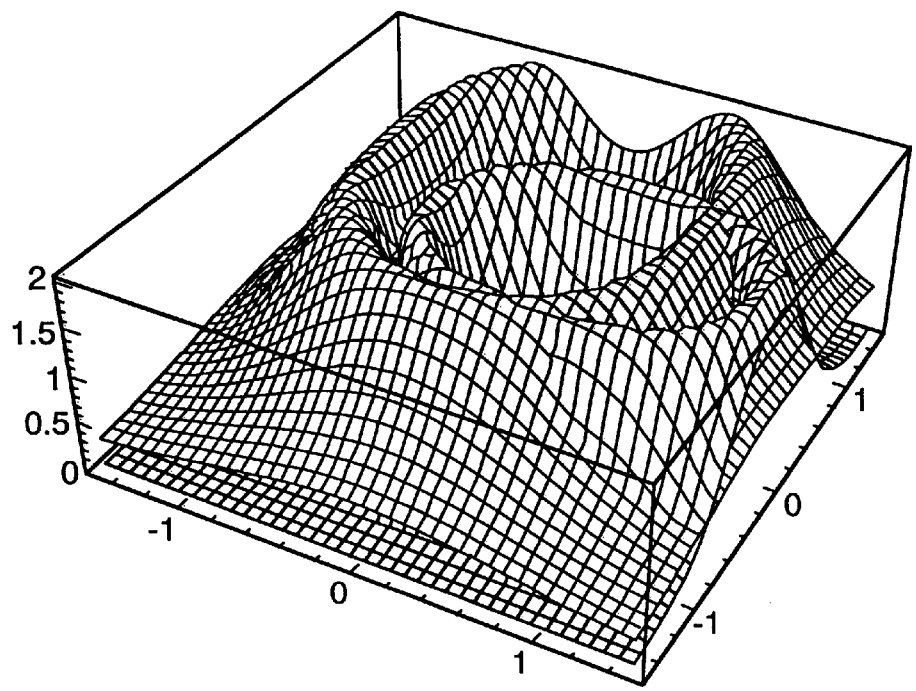
FIG. 10C places the probabilities plotted in FIGS. 10A and 10B in the same space.

The forward probability distributions p(D|m), given an object in the sensed two-dimensional region, for each receiving electrode $R_1$, $R_2$ are shown in FIGS. 10A and 10B, respectively. For clarity of presentation, the noise has been exaggerated dramatically and shown as a Gaussian thickness; were actual noise levels depicted, the surface features would be too minute to be plotted easily. Because mass distribution is considered within a two-dimensional region, each ellipse represents a cross-section of the ellipsoidal iso-signal shell associated with the two electrode pairs. FIG. 10C shows these two probability distributions in the same space. Their product, the joint forward probability p(D1, D2|m)=p(D1|m)p(D2|m), appears in FIG. 10D. The inverse probability distribution, p(m|D1,D2) is the same picture, multiplied by a prior probability and divided by a normalizing constant.

Figure 10D:
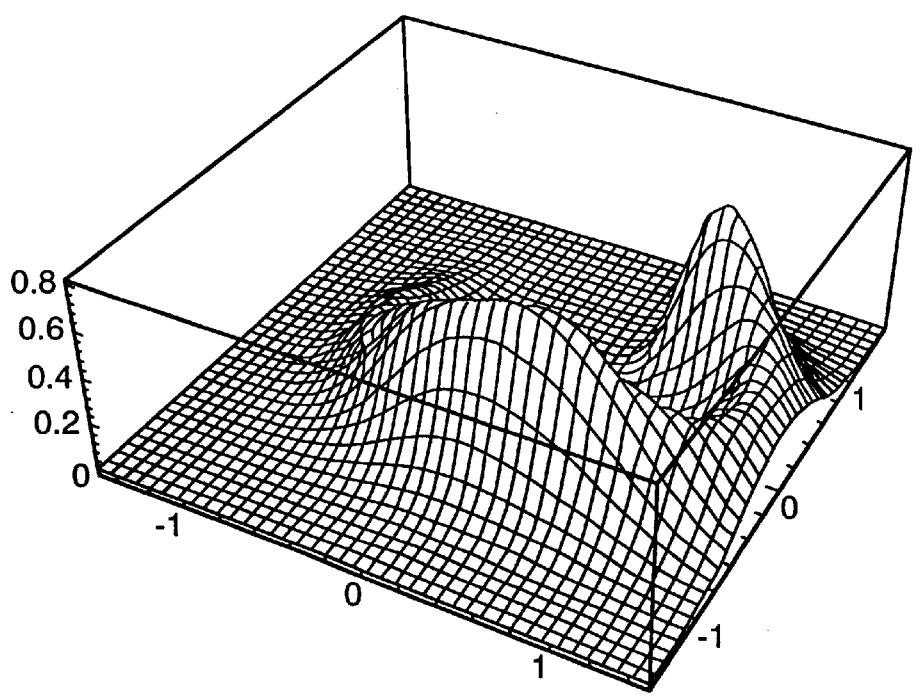
FIG. 10D shows the joint forward probability distribution for the receiving electrodes in the arrangement shown in FIG. 8.

The surfaces in FIGS. 10A–10C are not normalized with respect to m (i.e., the figures depict p(D|m) and not p(m|D)), because the heights of the two marginal distributions are not in fact the same; their actual heights would make FIG. 10C less clear. The important feature of FIG. 10C is the point where the straight sections of the ovals intersect perpendicularly. In FIG. 10D, which shows the normalized joint distribution (the product of the first two distributions, normalized), this intersection point appears as the sharper peak. The sensor geometry is desirably chosen such that the shells intersect to form a single relatively sharp peak, which explains sensor readings (in terms of inferred object positions) with the least uncertainty or likelihood of error. The prior probability term is used to restrict solutions to the region of this peak and exclude other peaks (e.g., in FIG. 10D, the more rounded peak that would yield greater inversion ambiguity) in a manner consistent with intended system use.

Since we have thus far assumed that the object is point-like, the uncertainties (i.e., the sharpness of the probability peak at the maximum, with greater sharpness reflecting less uncertainty) are due to the field, not to the object. This curvature may be represented by the Hessian matrix of the probability distribution evaluated at the point of maximum probability, and the uncertainty by the inverse Hessian (i.e., the covariance matrix). If, however, the object were not point-like, additional uncertainties would likely arise, flattening the distribution further (at least in some directions). It is possible to "calibrate out" the intrinsic ambiguities due to the sensor layout (e.g., by multiplying the uncertainties at each point by the principal curvatures for the single-point ambiguity class, or by subtracting the inverse principal curvatures), so that any detected ambiguities represent a spread in the distribution being measured. This, in turn, can provide a way to estimate the size and orientation of a mass of known volumetric shape: simply use the "uncertainty ellipsoid" defined by the principal curvatures.

It should be stressed that, since log(x) is a monotonically increasing function, maximizing log p(m|D) or minimizing −log p(m|D) produces the same m as maximizing p(m|D). It is generally preferable to work with log probabilities rather than probabilities: computation time is saved since exponentials disappear and multiplication and division operations become addition and subtraction; and multiplying many probabilities together results in very small numbers that can make numerical precision difficult. The conditional log probability can be represented as:

$$-\log p(m|D) = \sum_{i}^{N} \frac{(D_i - f_i(m))^2}{2\sigma^2} + \sum_{j} \log(1 + e^{-\beta x_j}) - \log c$$

This form offers the familiar interpretation of the sum of squared errors between the data and the data predicted by the model, with an additional error term derived from the prior probability.

The process of maximizing log probability, which corresponds to minimizing the prior term plus the sum of squared error between the measured value and that predicted by the current estimate of object position, can be computationally intensive. If faster (although cruder) solutions are desired, one can instead generate a set of input-output data using the forward model, and, using well-known function-approximation or curve-fitting techniques, fit to this dataset surfaces mapping sensor values to object positions. Once the surfaces are fit, evaluating them is more computationally efficient than maximizing a function each time. On the other hand, function fitting can itself prove difficult, and may not be applicable at all to certain classes of inverse problems. Those of skill in the art will readily appreciate the suitability of function fitting to particular problems.

Finally, it should be noted that the forward model presumes a known electrode geometry, and that ordinarily this is specified in advance (design of an optimal electrode distribution for a particular problem is discussed below). However, if the geometry is not known, it is possible to use electrode field measurements to determine electrode positions if measurements are first made when nothing is in the field. For example, if the electrodes are confined to positions along a single dimension (specified by a single variable), three electrodes suffice to mutually determine relative positions, because n(n−1)/2 for n=3 is three, and there are exactly three unknown position variables. In two dimensions, five electrodes are needed (2 coordinates×5 electrodes=5(5−1)/2), and in three dimensions, seven electrodes are needed. Any of the above-discussed approaches to inversion can be used to locate the electrodes given measurements sufficient to determine the location.

5. Optimal Sensor Design

The inverse curvature of a peak in a particular direction gives the uncertainty of the estimate of the parameter value (or linear combination of parameter values) corresponding to that direction. The amount of information provided by a measurement can be quantified by the change in entropy of the distribution that results from the measurement. As shown above, ill-posed (underdetermined) problems can be made well-posed by specifying additional constraints on the feasible set—in particular, by encoding constraints (such as prior or joint probabilities) in the probability distribution that defines the initial feasible set. The problem of designing optimal sensor arrays may be approached in terms of maximizing the expected information provided by a measurement.

Once the basic degeneracies have been broken, either by collecting sufficient data and/or imposing constraints by means of a prior probability to produce a single maximum in the log probability, the uncertainty about the best setting of model parameters may be represented, as discussed above, by the inverse Hessian matrix $A^{-1}$ evaluated at the maximum. The uncertainty reflects the adequacy of the electrode geometry to facilitate inversion for the space and cases of interest. The Hessian A gives the curvature, which is a measure of confidence or certainty. In the eigenvector basis of A, in which it is a diagonal, the diagonal elements (the eigenvalues) $A_{ii}$ represent the curvature along each of the eigenvector directions (known as the principal directions). The curvatures along the principal directions are called the principal curvatures. The product of the curvature, the Gauss curvature, which serves as a summary of the certainty at a point, is given by the determinant of A. The average curvature is given by $$\frac{1}{2} \text{trace } A = \frac{A_{11} + A_{22}}{2}.$$

Finally, the curvature in a particular direction v=(cos θ, sin θ) is given by Euler's formula:

$$\kappa = v^T A v = \kappa_1 \cos^2 \theta + \kappa_2 \sin^2 \theta$$

The inverse of A in this basis is the matrix with diagonal elements $1/A_{ii}$. Thus, the inverse Hessian specifies "radii of curvature" of the probability distribution, which can be used as a measure of uncertainty. The determinant and trace of the Hessian are independent of coordinates, so these may be used as local measures of the "Gauss uncertainty" and the mean uncertainty.

The most global measure of uncertainty is the entropy. The change in entropy of the p(m|D) distribution resulting from the collection of new data measures the change in uncertainty about the values of the model parameters, including uncertainty due to multiple maxima given a set of measurements. The change in total entropy ΔH of the ambiguity class m resulting from a measurement $D_{n+1}$ is $$\Delta H(m|D_{n+1}) = H(m|D_{n+1}) - H(m|D_n)$$

where $$H(m|D_n) = -\int p(m|D_n) \log p(m|D_n) \, dm$$

The expected change in entropy given a new piece of data (i.e., the change in entropy averaged over possible data values) gives a basis for comparing sensor geometries. The expected value of H(m|D) is $$I = \int p(D) \, H(m|D) \, dx$$

where x is an actual object position, f is the forward model and D=f(x). Thus, $$I = \int p(f(x)) \, H(m|f(x)) \, dx$$

and substituting, $$I = \int p(f(x)) \, [-\int p(m|f(x)) \log p(m|f(x)) dm] \, dx$$

I therefore measures the quality of sensor geometry. By analogy with coding theory, the best measurement procedure (for single measurements) reduces the entropy as much as possible. One can therefore search for optimal sensor geometries by minimizing I. Evaluating the entropy integrals, and averaging over all possible data values, may be accomplished numerically using, for example, Monte-Carlo techniques.

6. Applications

The present invention is amenable to a wide variety of usages involving the detection of user positions and gestures as a means of conveying information. In a computer environment, multiple electrode pairs can serve as a position-sensing device, providing output equivalent to that of a two- or three-dimensional mouse or tablet pen without the need for any mechanical assemblies. For example, placing the electrodes on or beneath a desk transforms its surface into an "active" element of the computer interface. Movement of a user's empty hand over the desk provides an application program with positional information in two or three dimensions. However, unlike mechanical sensing devices, the present invention can also recover gestural information derived from height, position and changes in mass distribution. For example, a two-dimensional mouse can utilize the planar coordinate location of the user's hand to specify position, with upward movement of the hand corresponding to the familiar mouse click; for this application, which requires some three-dimensional sensing capability, the electrode arrangements shown in FIG. 8 or FIG. 9 can be utilized. In this case, high resolution is necessary only in two dimensions, since upward movement is relevant only insofar as it exceeds a predetermined height threshold. Alternatively, the invention can be configured to recognize opening and closing of the hand as a click gesture by sensing change in the observed mass (hand) size; once again, high-resolution determination of size is unnecessary, only detection of a characteristic change.

In another implementation, the user's sweep of his hand across the desk from left to right generates digital data that can be interpreted as by an application program (such as a text display and/or editing facility) as a page-turning or subject-browsing command. The invention can simulate a multi-channel joystick by distinguishing the different patterns of data generated by squeezing motions, hand tilts and button-pushing gestures. The length scale of the invention, even when employed strictly as a position-sensing device, can also be varied considerably to suit different applications. Relatively wide electrode spacing is compatible with monitoring the movement of a user's entire hand or even the position of a person within a room, while smaller (e.g., 1 cm) spacings can be used to facilitate responses to small movements of a finger.

The invention can also be used in conjunction with compliant members having known elasticity characteristics, and which may therefore be used to generate signals indicative not only of position, but of the force being exerted on the resistive member. For example, by interposing an elastic element over a surface containing a set of electrodes, the height of the user's hand reflects the force exerted on the element, thereby further expanding the range of gestural information that may be sensed.

When the sensors are included as part of a unitary device, such as a laptop or notebook computer or a video game, interactive capabilities expand due to the ability to fix position relative to the screen. A multiple-electrode-pair array mounted at appropriate locations within the computer housing can provide a "control space" above the keyboard, with the invention generating data representing the three-dimensional position and orientation of the user's hand. Thus, by generating an array of on-screen buttons and sensing the position of the user's hand or finger relative to the screen, the computer can interpret the user's gestures as "pushing" the various buttons even though contact is never made with the screen.

In a similar way, the invention can be applied to devices other than computers (e.g., appliances, televisions, furniture, etc.) to facilitate user interaction. By associating the invention with an appliance containing various manually operated buttons, switches or the like, a user's proximity to these devices can be sensed and the consequences of impending actions evaluated before they are completed. Thus, for example, as the user's hand approaches the ignition key of an automobile, an audible tone and/or visible display can alert him to shift into parking gear before turning off the engine. The invention can also be used to remotely operate appliances such as televisions or recording systems without the need for the traditional hand-held device. And because the electrodes need not be exposed to the atmosphere, the invention is especially useful in controlling sealed (e.g., waterproof) devices, potentially replacing expensive isolation switches and broadening user control over such devices.

On a larger scale, the invention can be used to sense proximity to a reference object for security purposes, to warn of danger, or to conserve energy by withholding power until a potential user approaches the object. Distribution of a series of sensing capacitors about a room enables the invention to provide output indicative of a user's position within the room, the number of people in the room and their relative positions, etc. The accuracy of this information, of course, depends on the resolution necessary to the application and the number of sensors employed. For example, a security system that provides a trigger signal upon detection of a single person entering a reference space requires less resolution than an application that monitors the positions of multiple individuals.

It will therefore be seen that the foregoing represents a highly general and extensible approach to characterizing the position and orientation of an object within a defined space using electric fields. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. Apparatus for characterizing at least one property selected from mass distribution, position and orientation of an electrically conductive mass within a defined space, the apparatus comprising:
   a. a plurality of electrodes disposed proximate to the space and with defined positions relative to each other;
   b. an AC source;
   c. means for connecting the AC source to one of the electrodes to create an electric field around the mass;
   d. means for measuring current levels through a plurality of the electrodes to produce a measurement set; and e. processor means for inferring, from the measurement set, the instance of the property which, according to a forward model relating a plurality of instances of the property to corresponding expected current levels through a plurality of the electrodes given an AC signal through one of the electrodes, produces expected current levels closest to the measured levels.

2. The apparatus of claim 1 wherein the processor is configured to infer by:
   a. selecting an arbitrary instance of the property;
   b. solving the forward model for the property instance to produce a set of expected current levels;
   c. computing an error metric indicating the difference between the expected current levels and the measured current levels;
   d. modifying the property instance to reduce the error metric; and
   e. repeating steps (b)–(d) until the error metric is minimized.

3. The apparatus of claim 1 wherein the processor is configured to infer by:
   a. deriving, from each measurement of the measurement set, a probability distribution characterizing the property instance responsible for the measurement;
   b. multiplying the probability distributions together into an ensemble probability distribution; and
   c. deriving, from the ensemble probability distribution, the property instance to a maximum probability level.

4. The apparatus of claim 1 wherein the measuring means measures current through the electrodes other than the electrode connected to the AC source.

5. The apparatus of claim 1 wherein:
   a. the connecting means is configured to connect the AC source to another of the electrodes;
   b. the measuring means is responsive to the connecting means such that, with the AC source so connected, the measuring means measures the current through a plurality of the electrodes to produce a comparison set, the comparison set comprising measurements differing from those of the measurement set in a manner characteristic of a unique degenerate case; and
   c. the processor means is configured to distinguish among degenerate cases by comparing the measurement set with the comparison set.

6. The apparatus of claim 3 wherein the processor means is further configured to multiply at least one of the probability distributions by a prior probability before multiplying the probability distributions together into an ensemble probability distribution, the prior probability restricting derivable property instances.

7. The apparatus of claim 3 wherein the processor means is further configured to assign a confidence level to the maximum probability by normalizing the ensemble probability distribution.

8. The apparatus of claim 3 wherein the electrodes are arranged such that the probability distributions intersect to form a single relatively sharp peak.

9. The apparatus of claim 8 wherein the processor means is further configured to multiply at least one of the probability distributions by a prior probability before multiplying the probability distributions together into an ensemble probability distribution, the prior probability restricting derivable property instances to the region of this peak and excluding other peaks.

10. Apparatus for quantifying at least one unknown parameter pertaining to a property selected from size, position and orientation of an electrically conductive mass within a defined space and having a predetermined mass distribution, each parameter representing an independent degree of freedom, the apparatus comprising:
    a. a plurality of electrodes disposed proximate to the space and with defined positions relative to each other, the electrodes being sufficient in number to resolve the unknown parameter;
    b. an AC source;
    c. means for connecting the AC source to one of the electrodes to create an electric field around the mass;
    d. means for measuring current levels through a plurality of the electrodes to produce a measurement set; and
    e. processor means for inferring, from the measurement set, a value of the unknown parameter which, according to a forward model relating a plurality of instances of the parameter to corresponding expected current levels through a plurality of the electrodes given an AC signal through one of the electrodes, produces expected current levels closest to the measured levels.

11. The apparatus of claim 10 wherein the number of electrodes is sufficient to produce three independent measurements, the mass exhibits effective spherical symmetry or has a known shape and orientation, and the unknown parameters are selected from (a) two-dimensional position and size and (b) three-dimensional position.

12. The apparatus of claim 10 wherein the number of electrodes is sufficient to produce four independent measurements, the mass exhibits effective spherical symmetry or has a known shape and orientation, and the unknown parameters are three-dimensional position and size.

13. The apparatus of claim 10 wherein the number of electrodes is sufficient to produce four independent measurements, the mass is elongated and has a major axis and a minor axis, and the unknown parameters are selected from (a) two-dimensional position and lengths of the major axis and the minor axis, and (b) three-dimensional position and length of the major axis or the minor axis.

14. The apparatus of claim 10 wherein the number of electrodes is sufficient to produce five independent measurements, the mass is elongated and has a major axis and a minor axis, and the unknown parameters are selected from (a) three-dimensional position and length of the major axis and the minor axis, and (b) three-dimensional position and mass orientation.

15. The apparatus of claim 10 wherein the number of electrodes is sufficient to produce six independent measurements, the mass is elongated and has a major axis and a minor axis, and the unknown parameters are three-dimensional position, orientation and length of the major axis or the minor axis.

16. Apparatus for obtaining the distribution of an electrically conductive mass within a defined space, the mass having a size within a predetermined range, the apparatus comprising:
    a. a plurality of electrodes disposed proximate to the space and with defined positions relative to each other, the electrodes being sufficient in number to resolve the unknown parameter;
    b. an AC source;
    c. means for connecting the AC source to one of the electrodes to create an electric field around the mass;
    d. means for measuring current levels through a plurality of the electrodes; and
    e. processor means configured to (i) for each measurement, localize the mass within a spatial region spanning first and second spatial boundaries corresponding to first and second iso-signal shells, the iso-signal shells being established by the predetermined size range of the mass and the measured current level, and (ii) combine the spatial regions into a representation of a composite spatial region containing the mass, the composite spatial region approximating the distribution of the mass.

17. The apparatus of claim 16 wherein the processor means is configured to establish the iso-signal shells based on a forward model relating mass locations to corresponding expected current levels through a plurality of the electrodes given an AC signal through one of the electrodes.

18. The apparatus of claim 17 wherein the iso-signal shells for each measurement are established by solving the forward model to produce minimally and maximally sized iso-signal shells consistent with the measured current level.

19. The apparatus of claim 10 wherein the means for measuring current levels and the means for connecting the AC source comprise, for each of the plurality of electrodes:
   a. a first amplifier stage having an input and an output;
   b. a second amplifier stage having an output and connected to receive the output of the first amplifier stage;
   c. a synchronous detector connected to the AC source and the output of the second amplifier stage; and
   d. a switch for selectably connecting the AC source to the input of the first amplifier stage such that, with the AC source connected, an AC signal is applied to the electrode and the second amplifier stage receives a voltage proportional to current into the electrode.

20. The apparatus of claim 19 further comprising a low-pass filter connected to the synchronous detector.

21. The apparatus of claim 19 wherein the first and amplifier stages are physically located on the electrode.

22. A position-sensing device for sensing a three-dimensional position of an electrically conductive mass, the apparatus comprising:
   a. at least three electrodes disposed proximate to the space and with defined positions relative to each other;
   b. an AC source;
   c. means for connecting the AC source to one of the electrodes to create an electric field around the mass;
   d. means for measuring current levels through a plurality of the electrodes to produce a measurement set; and
   e. processor means for inferring, from the measurement set, the three-dimensional position of the mass, the processor being configured to infer the three-dimensional position according to a forward model relating position to corresponding expected current levels through a plurality of the electrodes given an AC signal through one of the electrodes, the inferred position producing expected current levels closest to the measured levels.

23. A method of sensing a three-dimensional position of an electrically conductive mass, the method comprising the steps of:
   a. disposing at least three electrodes proximate to the space and with defined positions relative to each other;
   b. providing an AC source;
   c. connecting the AC source to one of the electrodes to create an electric field around the mass;
   d. measuring current levels through a plurality of the electrodes to produce a measurement set; and
   e. inferring, from the measurement set, the three-dimensional position of the mass according to a forward model relating three-dimensional position to corresponding expected current levels through a plurality of the electrodes given an AC signal through one of the electrodes, the inferred position producing expected current levels closest to the measured levels.

24. The apparatus of claim 22 comprising four electrodes.

25. A position-sensing device for sensing a two-dimensional position of an electrically conductive mass and an offset, with respect to the two-dimensional position, along a third dimension, the apparatus comprising:
   a. at least three electrodes disposed proximate to the space and with defined positions relative to each other;
   b. an AC source;
   c. means for connecting the AC source to one of the electrodes to create an electric field around the mass;
   d. means for measuring current levels through a plurality of the electrodes to produce a measurement set; and
   e. processor means for inferring, from the measurement set, the two-dimensional position of the mass and the existence of an offset, along a third dimension, exceeding a predetermined threshold, the processor being configured to infer the two-dimensional position and the offset according to a forward model relating position to corresponding expected current levels through a plurality of the electrodes given an AC signal through one of the electrodes, the inferred position and offset producing expected current levels closest to the measured levels.

26. A method of sensing a two-dimensional position of an electrically conductive mass and an offset, with respect to the two-dimensional position, along a third dimension, the method comprising the steps of:
   a. disposing at least three electrodes proximate to the space and with defined positions relative to each other;
   b. providing an AC source;
   c. connecting the AC source to one of the electrodes to create an electric field around the mass;
   d. measuring current levels through a plurality of the electrodes to produce a measurement set; and
   e. inferring, from the measurement set, the two-dimensional position of the mass and the existence of an offset, along a third dimension, exceeding a predetermined threshold,
wherein the inferring step comprises providing a forward model relating position to corresponding expected current levels through a plurality of the electrodes given an AC signal through one of the electrodes, and identifying a two-dimensional position and offset producing expected current levels closest to the measured levels.

27. A method of characterizing at least one property selected from mass distribution, position and orientation of an electrically conductive mass within a defined space, the method comprising the steps of:
   a. disposing a plurality of electrodes proximate to the space and with defined positions relative to each other;
   b. providing an AC source;
   c. connecting the AC source to one of the electrodes to create an electric field around the mass;
   d. measuring current levels through a plurality of the electrodes to produce a measurement set; and
   e. inferring, from the measurement set, the instance of the property which, according to a forward model relating a plurality of instances of the property to corresponding expected current levels through a plurality of the electrodes given an AC signal through one of the electrodes, produces expected current levels closest to the measured levels.

28. The method of claim 27 wherein the measuring step comprises measuring current through a plurality of electrodes other than the electrode connected to the AC source.

29. The method of claim 27 wherein:
   a. the connecting step comprises connecting the AC source to another of the electrodes;
   b. the measuring step comprises measuring the current through a plurality of the electrodes to produce a comparison set, the comparison set comprising measurements differing from those of the measurement set in a manner characteristic of a unique degenerate case; and
   c. the inferring step comprises distinguishing among degenerate cases by comparing the measurement set with the comparison set.

30. A method of quantifying at least one unknown parameter pertaining to a property selected from size, position and orientation of an electrically conductive mass within a defined space and having a predetermined mass distribution, each parameter representing an independent degree of freedom, the method comprising the steps of:
   a. disposing a plurality of electrodes proximate to the space and with defined positions relative to each other, the electrodes being sufficient in number to resolve the unknown parameter;
   b. providing an AC source;
   c. connecting the AC source to one of the electrodes to create an electric field around the mass;
   d. measuring current levels through a plurality of the electrodes to produce a measurement set; and
   e. inferring, from the measurement set, a value of the unknown parameter which, according to a forward model relating a plurality of instances of the parameter to corresponding expected current levels through a plurality of the electrodes given an AC signal through one of the electrodes, produces expected current levels closest to the measured levels.

31. The method of claim 30 wherein the measurement set comprises three independent measurements, the mass exhibits effective spherical symmetry or has a known shape and orientation, and the unknown parameters are selected from (a) two-dimensional position and size and (b) three-dimensional position.

32. The method of claim 30 wherein the measurement set comprises four independent measurements, the mass exhibits effective spherical symmetry or has a known shape and orientation, and the unknown parameters are three-dimensional position and size.

33. The method of claim 30 wherein the measurement set comprises four independent measurements, the mass is elongated and has a major axis and a minor axis, and the unknown parameters are selected from (a) two-dimensional position and lengths of the major axis and the minor axis, and (b) three-dimensional position and length of the major axis or the minor axis.

34. The method of claim 30 wherein the measurement set comprises five independent measurements, the mass is elongated and has a major axis and a minor axis, and the unknown parameters are selected from (a) three-dimensional position and length of the major axis and the minor axis, and (b) three-dimensional position and mass orientation.

35. The method of claim 30 wherein the measurement set comprises six independent measurements, the mass is elongated and has a major axis and a minor axis, and the unknown parameters are three-dimensional position, orientation and length of the major axis or the minor axis.

36. A method of obtaining the distribution of an electrically conductive mass within a defined space, the mass having a size within a predetermined range, the method comprising the steps of:
   a. disposing a plurality of electrodes proximate to the space and with defined positions relative to each other, the electrodes being sufficient in number to resolve the unknown parameter;
   b. providing an AC source;
   c. connecting the AC source to one of the electrodes to create an electric field around the mass;
   d. measuring current levels through a plurality of the electrodes;
   e. for each measurement, localizing the mass within a spatial region spanning first and second spatial boundaries corresponding to first and second iso-signal shells, the iso-signal shells being established by the predetermined size range of the mass and the measured current level; and
   f. combining the spatial regions into a representation of a composite spatial region containing the mass, the composite spatial region approximating the distribution of the mass.

37. The method of claim 30 wherein the measurement step is accomplished by:
   a. providing, for each electrode, a first amplifier stage having an input and an output;
   b. providing, for each electrode, a second amplifier stage having an output and connected to receive the output of the first amplifier stage;
   c. providing, for each electrode, a synchronous detector connected to the AC source and the output of the second amplifier stage; and
   d. selectably connecting the AC source to the input of the first amplifier stage such that, with the AC source connected, an AC signal is applied to the electrode and the second amplifier stage receives a voltage proportional to current into the electrode.

38. The method of claim 37 further comprising the step of connecting a low-pass filter to the synchronous detector.

39. The method of claim 37 further comprising the step of disposing the first and second amplifier stages on each electrode.

40. The method of claim 23 wherein four electrodes are disposed proximate to the space and with defined positions relative to each other.

* * * * *